(12) United States Patent
Sekine et al.

(10) Patent No.: US 8,022,486 B2
(45) Date of Patent: Sep. 20, 2011

(54) CMOS SEMICONDUCTOR DEVICE

(75) Inventors: Katsuyuki Sekine, Yokohama (JP);
Tomonori Aoyama, Yokohama (JP);
Takuya Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 634 days.

(21) Appl. No.: 11/882,012

(22) Filed: Jul. 30, 2007

(65) Prior Publication Data

US 2009/0014809 A1    Jan. 15, 2009

(30) Foreign Application Priority Data

Jul. 31, 2006   (JP) ................................. 2006-208798
Jun. 15, 2007   (JP) ................................. 2007-158908

(51) Int. Cl.
*H01L 29/76*   (2006.01)
*H01L 29/94*   (2006.01)
*H01L 31/062*  (2006.01)
*H01L 31/113*  (2006.01)

(52) U.S. Cl. ........ 257/402; 257/369; 257/406; 257/407; 257/412; 257/E27.062

(58) Field of Classification Search ................. 257/369, 257/402, 405, 406, 407, 410, 411, 412, E27.062
See application file for complete search history.

(56) References Cited

U.S. PATENT DOCUMENTS

| 6,967,379 | B2 | 11/2005 | Matsuo | |
|---|---|---|---|---|
| 7,005,716 | B2 | 2/2006 | Lin et al. | |
| 7,479,683 | B2 * | 1/2009 | Bojarczuk, Jr. et al. | 257/410 |
| 7,595,538 | B2 * | 9/2009 | Yamamoto | 257/410 |
| 2006/0102968 | A1 * | 5/2006 | Bojarczuk et al. | 257/392 |
| 2006/0131652 | A1 * | 6/2006 | Li | 257/350 |

OTHER PUBLICATIONS

Aoyama, T. et al., "In-situ HfSiON/SiO$_2$ Gate Dielectric Fabrication Using Hot Wall Batch System," IWGI, pp. 174-179, (2003).
Kim, Y. H. et al., "Systematic Study of Workfunction Engineering and Scavenging Effect Using NiSi Alloy FUSI Metal Gates with Advanced Gate Stacks," IEEE, 4 Sheets, (2005).

* cited by examiner

*Primary Examiner* — Shouxiang Hu
(74) *Attorney, Agent, or Firm* — Finnegan, Henderson, Farabow, Garrett & Dunner, L.L.P.

(57) ABSTRACT

A semiconductor device includes a semiconductor substrate, and a p-channel MOS transistor provided on the semiconductor substrate, the p-channel MOS transistor comprising a first gate dielectric film including Hf, a second gate dielectric film provided on the first gate dielectric film and including aluminum oxide, and a first metal silicide gate electrode provided on the second gate dielectric film.

4 Claims, 26 Drawing Sheets

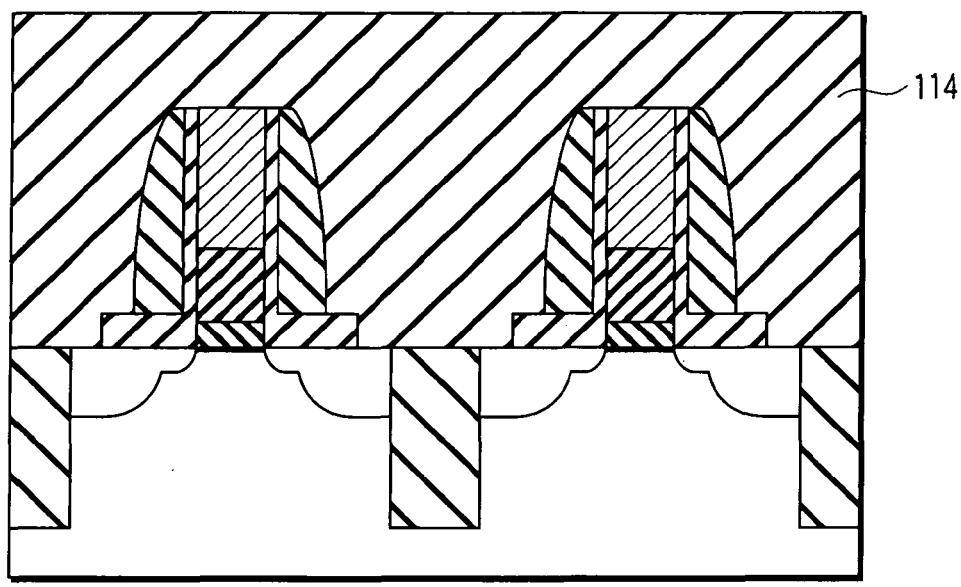
F I G. 24
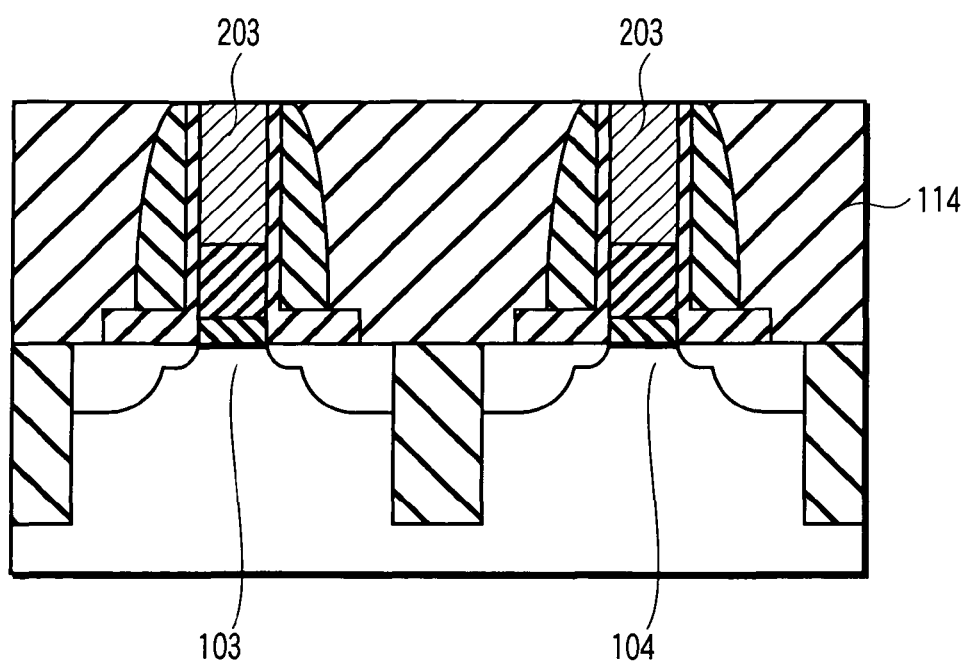
F I G. 25

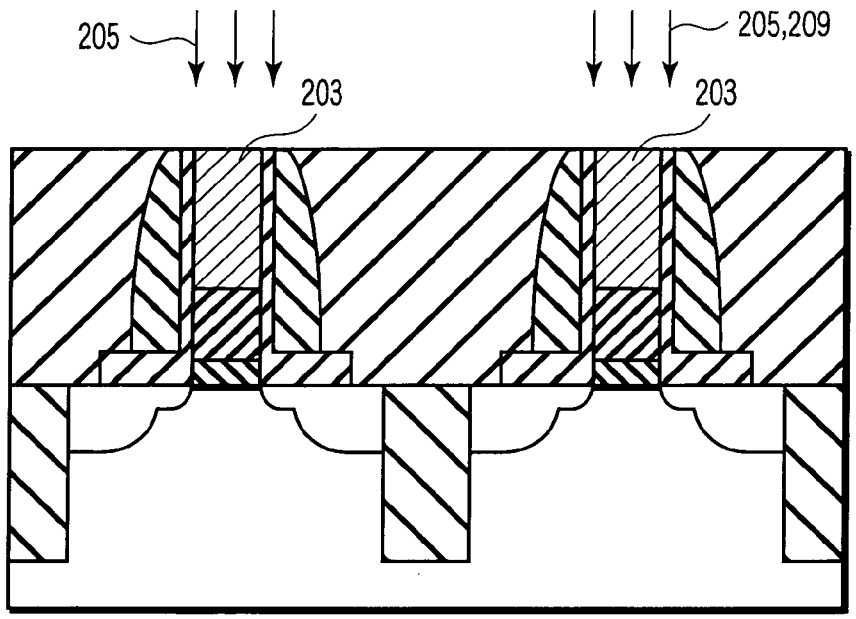
F I G. 26
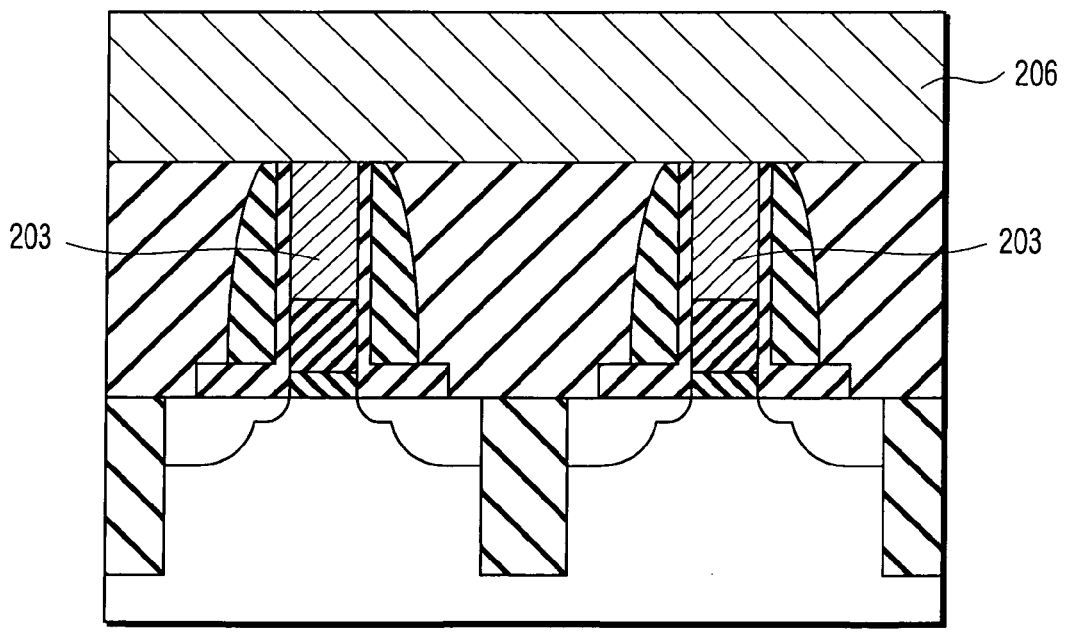
F I G. 27

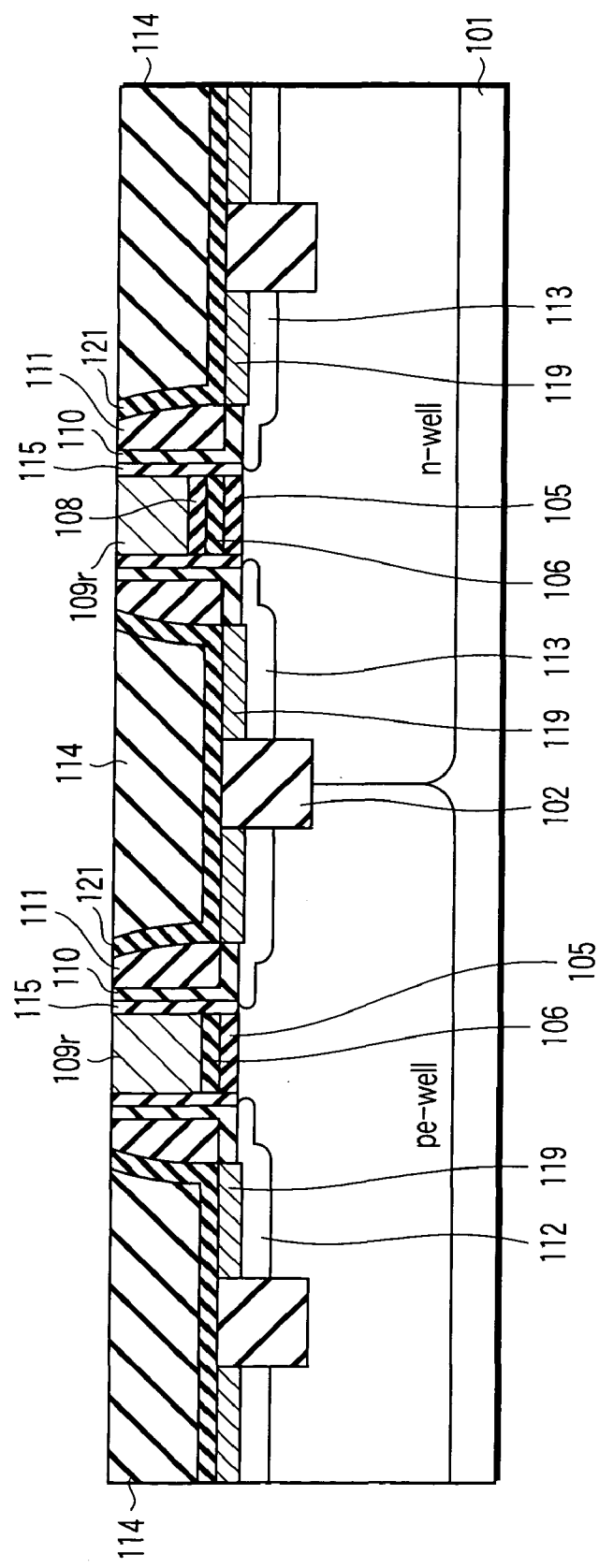
F I G. 41

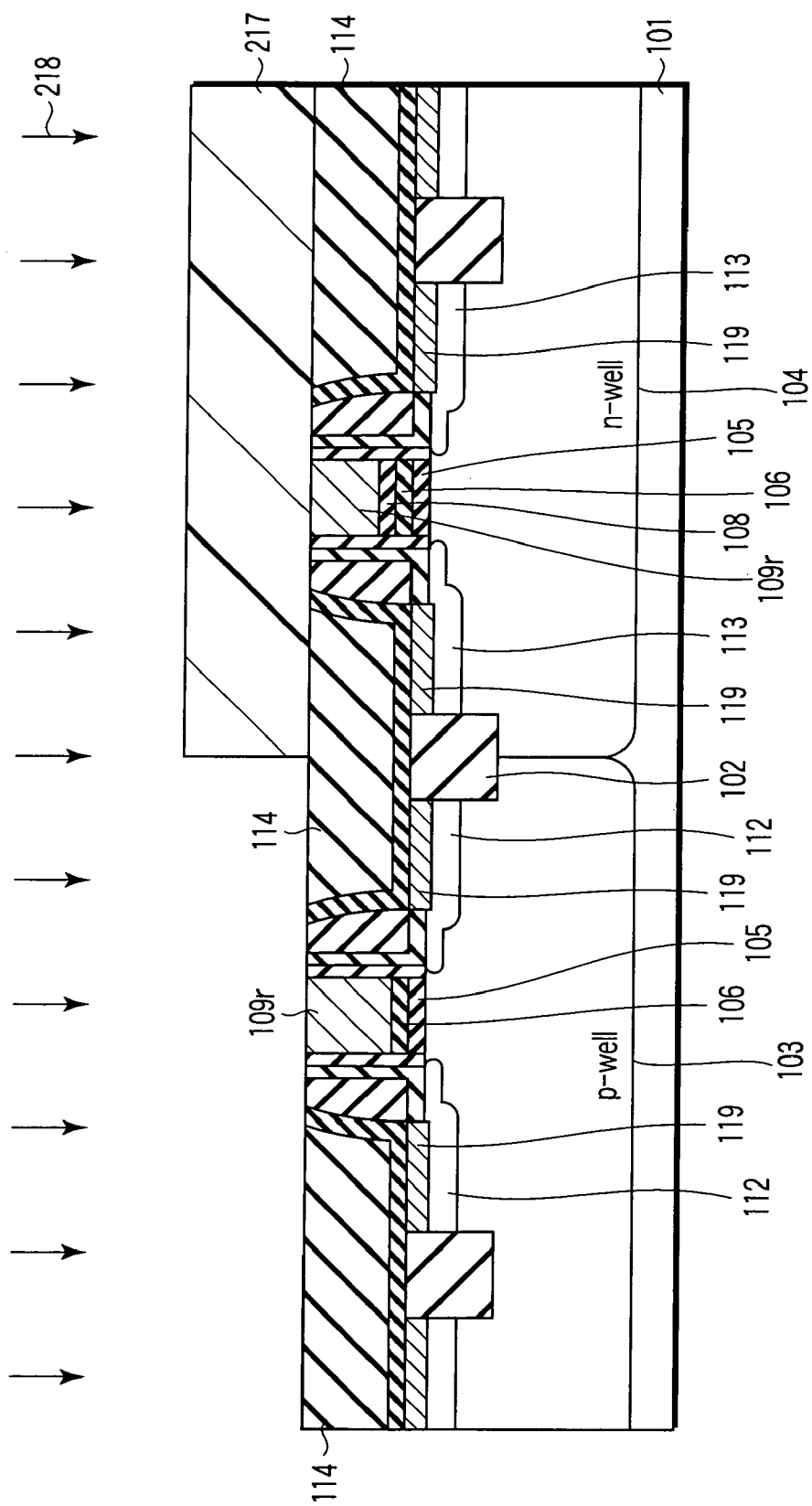
F I G. 42

CMOS SEMICONDUCTOR DEVICE

CROSS-REFERENCE TO RELATED APPLICATIONS

This application is based upon and claims the benefit of priority from prior Japanese Patent Applications No. 2006-208798, filed Jul. 31, 2006; and No. 2007-158908, filed Jun. 15, 2007, the entire contents of both of which are incorporated herein by reference.

BACKGROUND OF THE INVENTION

1. Field of the Invention

The present invention relates to a semiconductor device using a gate dielectric film including Hf (hafnium) and to a method for manufacturing the semiconductor device.

2. Description of the Related Art

With advance in the scale-down of a MOS transistor, a leakage current of a $SiO_2$ gate dielectric film and depletion of a polycrystalline silicon gate electrode become a big problem. The following technique has been proposed as one means for solving the foregoing problem. According to the technique, one of a high dielectric constant gate dielectric film, that is, gate dielectric film including Hf (Hf gate dielectric film) and a metal silicide gate electrode are combined.

The following method has been known to control a threshold voltage of a MOS transistor including a metal silicide gate electrode. According to the foregoing method, impurities such as boron, phosphorus and antimony are implanted into the metal silicide gate electrode.

However, in the case where the Hf gate dielectric film and the metal silicide gate electrode are combined, there is the following problem. Even if impurity is implanted into the metal silicide gate electrode, it is difficult to control the threshold voltage due to so-called Fermi level pinning phenomenon. In particular, in the case of p-channel MOS transistor, as the threshold voltage shifts largely to negative side in addition to inversion capacitance becomes small, the problem that desired drain current is not secured occurs (T. Aoyama, et al., Proc. IWGI 174 (2003)).

In the case where aluminum (metal) is implanted into the metal silicide gate electrode, and then, heat treatment is carried out to form an aluminum film between the metal silicide gate elected and the Hf gate dielectric film, a magnitude (|Vthn|) of a threshold voltage (Vthn) of an n-channel MOS transistor is made small (Y. H. Kim et al., Systematic Study of Work function Engineering and Scavenging Effect Using NiSi alloy FUSI Metal Gate with Advanced Gate Stacks, 2005 IEEE).

However, according to the foregoing method, a magnitude (|Vthp|) of a threshold voltage (Vthp) of a p-channel MOS transistor is no made small.

That is, in the case where the Hf gate dielectric film and the metal silicide gate electrode are combined, it is difficult to make small both |Vthn| and |Vthn| according to the conventional method.

BRIEF SUMMARY OF THE INVENTION

According to an aspect of the present invention, there is provided a semiconductor comprising: a semiconductor substrate; and a p-channel MOS transistor provided on the semiconductor substrate, the p-channel MOS transistor comprising a first gate dielectric film including Hf, a second gate dielectric film provided on the first gate dielectric film and including aluminum oxide, and a first metal silicide gate electrode provided on the second gate dielectric film.

According to an aspect of the present invention, there is provided a method for manufacturing a semiconductor device, the semiconductor device comprising: a semiconductor substrate; a p-channel MOS transistor provided on the semiconductor substrate, the p-channel MOS transistor comprising a first gate dielectric film including Hf, a second gate dielectric film provided on the first gate dielectric film and including aluminum oxide; and a first metal silicide gate electrode provided on the second gate dielectric film; the method comprising: forming the first gate dielectric film on the semiconductor substrate; forming a dielectric film including silicon and oxygen on the first gate dielectric film; forming a silicon film on the dielectric film; introducing aluminum into the silicon film; forming a refractory metal film on the silicon film; and heating the semiconductor substrate, the first gate dielectric film, the dielectric film, the silicon film, and the refractory metal film.

According to another aspect of the present invention, there is provided a method for manufacturing a semiconductor device, the semiconductor device comprising: a semiconductor substrate; a p-channel MOS transistor provided on the semiconductor substrate, the p-channel MOS transistor comprising a first gate dielectric film including Hf, a second gate dielectric film provided on the first gate dielectric film and including aluminum oxide, and a first metal silicide gate electrode provided on the second gate dielectric film; the method comprising: forming the first gate dielectric film on the semiconductor substrate; forming a silicon film on the first gate dielectric film; introducing aluminum and oxygen into the silicon film; forming a refractory metal film on the silicon film; and heating the semiconductor substrate, the first gate dielectric film, the silicon film, and the refractory metal film.

According to another aspect of the present invention, there is provided a method for manufacturing a semiconductor device, the semiconductor device comprising: a semiconductor substrate; a p-channel MOS transistor provided on the semiconductor substrate, the p-channel MOS transistor comprising a first gate dielectric film including Hf, a second gate dielectric film provided on the first gate dielectric film and including aluminum oxide, and a first metal silicide gate electrode provided on the second gate dielectric film; the method comprising: forming the first gate dielectric film on the semiconductor substrate; forming a metal silicide film including silicon and refractory metal on the first gate dielectric film and; introducing aluminum into the metal silicide film; and heating the semiconductor substrate, the first gate dielectric film, and the refractory metal film.

According to another aspect of the present invention, there is provided a method for manufacturing a semiconductor device, the semiconductor device comprising: a semiconductor substrate; a p-channel MOS transistor provided on the semiconductor substrate, the p-channel MOS transistor comprising a first gate dielectric film including Hf and oxygen, a second gate dielectric film provided on the first gate dielectric film and including aluminum oxide, and a first metal silicide gate electrode provided on the second gate dielectric film; the method comprising: forming the first gate dielectric film on the semiconductor substrate; forming a silicon film on the first gate dielectric film; introducing aluminum into the silicon film; and forming a refractory metal on the silicon film; and heating the semiconductor substrate, the first gate dielectric film, and the refractory metal film.

BRIEF DESCRIPTION OF THE SEVERAL VIEWS OF THE DRAWING

FIG. 24 is a cross-sectional view showing the method for manufacturing the semiconductor device according to the fourth embodiment following FIG. 23;

FIG. 25 is a cross-sectional view showing the method for manufacturing the semiconductor device according to the fourth embodiment following FIG. 24;

FIG. 26 is a cross-sectional view showing the method for manufacturing the semiconductor device according to the fourth embodiment following FIG. 25;

FIG. 27 is a cross-sectional view showing the method for manufacturing the semiconductor device according to the fourth embodiment following FIG. 26;

FIG. 41 is a cross-sectional view showing the method for manufacturing the semiconductor device according to the fifth embodiment following FIG. 40;

FIG. 42 is a cross-sectional view showing the method for manufacturing the semiconductor device according to the fifth embodiment following FIG. 41;

DETAILED DESCRIPTION OF THE INVENTION

Embodiments of the invention will be described below with reference to the drawings.

First Embodiment

Figure 1:
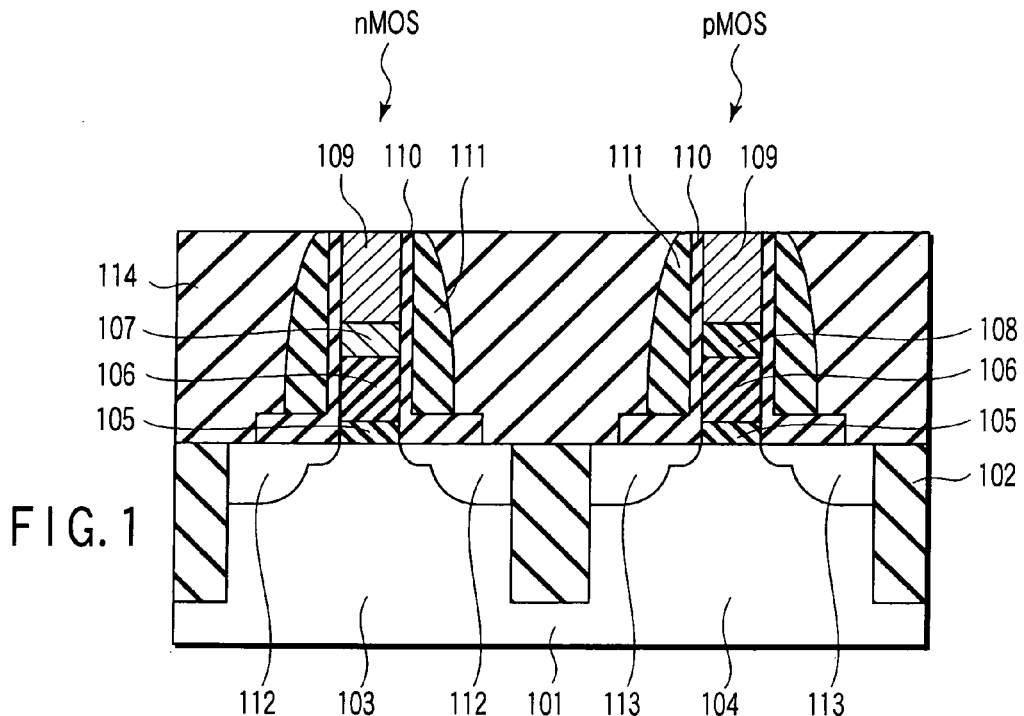
FIG. 1 is a cross-sectional view showing a semiconductor device according to a first embodiment.

FIG. 1 is a cross-sectional view showing a semiconductor device according to a first embodiment of the present invention. In the following description, a CMOS is given as an example of the semiconductor device.

In FIG. 1, 101 denotes a silicon substrate, 102 denotes an isolation dielectric film, 103 denotes an nMOS region, 104 denotes a pMOS region, 105 denotes a silicon oxide film (interface layer), 106 denotes a hafnium silicon oxynitride film (HfSiON film (first and third gate dielectric film including Hf), 107 denotes an aluminum film including small amount of oxygen (conductive film), 108 denotes a dielectric film including aluminum oxide (e.g., alumina ($Al_2O_3$) (hereinafter, referred to as AlO film (second gate dielectric film), 109 denotes a nickel silicide gate electrode (first and second metal silicide gate electrodes), 110 denotes a first spacer (sidewall spacer), 111 denotes a second spacer (sidewall spacer), 112 denotes a source/drain region (nMOS region) including extension, 113 denotes a source/drain region (pMOS region), 114 denotes an interlayer dielectric. The AlO film 108 may includes further a silicon oxide (e.g., $SiO_2$).

According to the present embodiment, the aluminum film 107 including small amount of oxygen is provided between the HfSiON film 106 and the nickel silicide gate electrode 109 of an n-channel MOS transistor, the AlO film 108 is provided between the HfSiON film 106 and the nickel silicide gate electrode 109 of a p-channel MOS transistor.

By employing the structure, a work function of the n-channel MOS transistor becomes about 4.1 eV, since the work function is determined by the nickel silicide gate electrode 109 and the aluminum film 107 including small amount of oxygen provided on the HfSiON film 106.

On the other hand, a work function of the n-channel MOS transistor becomes about 5.0 eV in pseudo due to the nickel silicide gate electrode 109 and fixed negative charges in the AlO film 108 provided on the HfSiON film 106.

As a result, the threshold voltage of the n-channel MOS transistor of the present embodiment is approximately the same as that of conventional n-channel MOS transistor using an $n^+$ type polycrystalline silicon film (gate electrode) and a silicon oxynitride film (gate dielectric film). In the same way, the threshold voltage of the p-channel MOS transistor of the present embodiment is approximately the same as that of conventional p-channel MOS transistor using a $p^+$ type polycrystalline silicon film (gate electrode) and a silicon oxynitride film (gate dielectric film).

In this manner, according to the present embodiment, as the work functions of the n-channel and p-channel MOS transistors are modulated by the aluminum film 107 including small amount of oxygen and the AlO film 108 existing between the HfSiON film 106 and the nickel silicide gate electrode 109, the work functions are controlled without changing the gate electrode materials.

Therefore, according to the present embodiment, the CMOS including the HfSiON film 106 and the nickel silicide gate electrode 109 having a low threshold voltage (|Vthn| and |Vthp|) is realized, which also realizes the thinning of electric film thickness by reduction which is a merit of adopting the silicide gate electrode and reduction of leakage current which is a merit of adopting the high dielectric constant gate dielectric film. The threshold voltage is reduced to the same as the threshold voltage of a CMOS using a conventional polycrystalline silicon film (gate electrode) and a silicon oxide film (gate dielectric film).

Even if the silicon oxide film (interface layer) 105 is removed from n-channel and p-channel MOS transistors, the same effects are obtained.

In addition, as for the n-channel MOS transistor, even if silicon is included in the aluminum film including small amount of oxygen 107 (conductive film), the same effects are obtained.

In addition, as for the p-channel MOS transistor, although it depends on the process, for example, a layer including silicon oxide as a main component is formed on a side contacting the HfSiON film 106, a layer including aluminum oxide (which may include silicon) as a main component is formed on a side contacting the nickel silicide gate electrode 109.

In the present embodiment, each work function of n-channel and p-channel MOS transistors using the HfSiON film is modulated by the aluminum film 107 including small amount of oxygen and the AlO film 108, it is confirmed that it is difficult to simultaneously control each work function of n-channel and p-channel MOS transistors by using a film including metal other than aluminum.

According to the structure of the present embodiment, the work function of the metal silicide gate electrode on the dielectric film including Hf is controlled to a range from 4.1 eV to 5.0 eV. This results from the following reasons. In the n-channel MOS transistor, even if a base material of the gate electrode is FUSI (fully silicided), the work function is given as a work function of Al segregated on the interface. Therefore, the work function is 4.1 eV. In the p-channel MOS transistor, even if the base material is FUSI, the work function increases up to 5.0 eV in pseudo by the fixed charges due to the aluminum oxide. On the contrary, according to the conventional technique, the work function is controlled to a range from 4.4 eV to 4.8 eV.

In the following second to fourth embodiments, the method for manufacturing the semiconductor device of the present embodiment will be described.

Second Embodiment

FIGS. 2 to 14 are cross-sectional views showing the method for manufacturing the semiconductor device according to a second embodiment. In the following figures, the portions corresponding to the portions shown in the previously mentioned drawings are denoted by the same reference numerals and omitted its detail explanation.

[FIG. 2]

An isolation dielectric film 102 is formed on a surface of a silicon substrate 101 for STI (Shallow Trench Isolation). Ion implantation and annealing are carried out to form well, and thereby, an nMOS region 103 and a pMOS region 104 are formed on the silicon substrate 101.

[FIG. 3]

The surface of the silicon substrate is cleaned using dilute hydrofluoric acid. Thereafter, heat treatment is carried out in an oxygen atmosphere at 700 to 900° C., and heat treatment is carried out in an ozone atmosphere at 200 to 400° C., or heat treatment is carried out in a vapor atmosphere at 600 to 800° C. In this way, silicon oxide film having a thickness of 0.6 to 1.0 nm is formed on the surface of the silicon substrate 101. A hafnium silicon oxynitride (HfSiON) film 106 is formed on the silicon oxide film 105.

The HfSiON 106 is formed by following process for instance.

First a hafnium silicon oxynitride film (HfSiON film) 7 is formed on the silicon oxide film 105 by MOCVD process. An example of the conditions for forming the HfSiO film is as follows. Temperature: 500 to 600° C., Source gas: gas including TDMAS (tetrakis-dimethylaminosilane), TDEAH (tetrakis-dietylaminohafnium) and oxygen. In the case of this film forming conditions, an HfSiO film including Hf of 50% and having a thickness of 1 to 3 nm is obtained.

Next, the HfSiO film is exposed in mixed plasma of Ar and $N_2$. Thereby, nitrogen is introduced into the HfSiO film. The introduction amount of nitrogen is, for example, 10 to 20 atom %. Thereafter, for recovery from the plasma damage, RTA is carried out in a nitrogen atmosphere at 800 to 1000° C. for 10 to 30 seconds, thereby the HfSiON film 106 is obtained.

[FIG. 4]

A silicon oxide film 201 is formed on the HfSiON film 106 by ALD process. An example of conditions for forming the film is as follows. Substrate temperature: 450°, Source gas: gas including TDMAS and $O_3$. The silicon oxide film 201 has a thickness of 0.5 nm, for instance.

[FIG. 5]

A resist pattern 202 covering the silicon oxide film 201 in the pMOS region 104 is formed. The silicon oxide film 201 in the nMOS region 103 is not covered with the resist pattern 202. Such the resist pattern 202 is obtained by applying resist on the entire surface of the silicon oxide film 201, and removing the resist in the nMOS region 103 by exposure and development, for instance.

[FIG. 6]

The silicon oxide film 20 in the nMOS region 103 is removed by wet treatment using dilute hydrofluoric acid using the resist pattern 202 as a mask.

[FIG. 7]

The resist pattern 202 is removed. A polycrystalline silicon film 203 is formed on the entire surface (nMOS region 103 and pMOS region 104) by CVD process. In the nMOS region 103, the polycrystalline silicon film 203 is formed on the HfSiON film 106, in the pMOS region 104, the polycrystalline silicon film 203 is formed on the silicon oxide film 201. An example of conditions for forming the polycrystalline silicon film 203 is as follows. Temperature: 600° C., Atmosphere (source gas): $SiH_4$. The polycrystalline silicon film 203 has a thickness of 150 nm, for instance.

[FIG. 8]

Gate processing is carried out using a mask not shown. In the nMOS region 103, the polycrystalline silicon film 203, the HfSiON film 106 and the silicon oxide film 105 are successively etched. In the PMOS region 104, the polycrystalline silicon film 203, the silicon oxide film 201, the HfSiON film 106 and the silicon oxide film 105 are successively etched. Extensions of source/drain regions 112 and 113 are formed by ion implantation and annealing.

[FIG. 9]

A first spacer 110 and a second spacer 111 are formed by known process. The materials of the first and second spacers 110 and 111 are selected such that the first spacer 110 is prevented from decreasing when a dielectric film to be processed into the second spacer 111 is etched. For example, the material of the first spacer 110 is silicon oxide, and the material of the second spacer 111 is silicon nitride. Thereafter, the remaining portions of the sour/drain regions 112 and 113 are formed by ion implantation and annealing. When the ion implantation is carried out, the first and second spacers 110 and 111 are used as a mask.

[FIG. 10]

An interlayer dielectric 114 is formed on the entire surface to cover the first spacer 110, the second spacer 111 and the polycrystalline silicon film 203.

[FIG. 11]

The interlayer dielectric 114 is polished by CMP (Chemical Mechanical Polishing) process to expose the upper surface of the polycrystalline silicon film 203.

[FIG. 12]

Aluminum ions 205 are implanted into the polycrystalline silicon film 203 in the nMOS and pMOS regions 103 and 104. The aluminum ions 205 are implanted from the exposed upper surface of the polycrystalline silicon film 203 into the inside thereof. An example of implantation conditions is as follows. Acceleration voltage: 30 keV, Dose: $1 \times 10^{15}$ atoms/$cm^2$.

[FIG. 13]

A nickel film 206 is formed on the entire surface (region including the polycrystalline silicon film 203). The nickel film 206 is formed by sputtering process, for instance. The nickel film 206 has a thickness of 150 nm, for instance.

[FIG. 14]

By heat treatment, a reaction (silicide reaction) between the polycrystalline silicon film 203 and the nickel film 206 is occurred, and thereby, a nickel silicide gate electrode 109 is formed. An example of heat treatment conditions are as follows. Heat treatment temperature: 300 to 400° C., Heat treatment time: 30 to 60 minutes.

At this time, the aluminum in the polycrystalline silicon film 203 is precipitated between the nickel silicide gate electrode 109 and the HfSiON film 106 by diffusion. The precipitated aluminum exists as it remains in the nMOS region 103. As a result, an aluminum film 107 including small amount of oxygen is formed on the HfSiON film 106 in the nMOS region 103. On the other hand, in the pMOS region 104, the precipitated aluminum reacts with the silicon oxide film 201. As a result, an AlO film 108 is formed on the HfSiON film 106 in the PMOS region 104. In the present embodiment, the AlO film 108 includes silicon oxides.

Thereafter, the semiconductor device shown in FIG. 1 is obtained through known process such as removing the surplus nickel film 206 by sulfate hydrogen peroxide.

In the second embodiment, the HfSiO layer 106 is formed using MOCVD process, the same effect is obtained by forming the HfSiO layer 106 using ALD process.

In addition, the source gas used for forming the HfSiO layer 106 is not limited to TDMAS, TDEAH, and $O_2$, the same effect is obtained by using other source gas.

In addition, in the present embodiment, nitrogen is introduced into the HfSiO layer 106 by plasma nitrification process, the same effect is obtained by using ammonium nitrification process.

In addition, in the present embodiment, a high dielectric constant gate dielectric film including Hf is the HfSiON film 106, the same effect is obtained by using a HfSiOx film, $HfO_2$ film, a lanthanum oxide film including Hf (HfLaO film) or a titanium oxide including Hf (HfTaO film). The high dielectric constant gate dielectric film including Hf has a dielectric constant of about 10 to 30.

In addition, in the present embodiment, as for the process of forming the silicon oxide film, the ALD process is used to form the silicon oxide film 201, the same effect is obtained when the silicon oxide film 201 is formed by sputtering process using $SiO_2$ as a target material, reactive sputtering process carried out in an oxygen added plasma atmosphere using Si as a target material, CVD process using $SiH_4$ and $N_2O$ gas or CVD process using $SiCl_2H_2$ and $N_2O$.

In addition, in the present embodiment, nickel silicide is given as one example, the same effect is obtained even if a silicide using other refractory metal (e.g., Pt, Co).

In the present embodiment, aluminum is introduced into the silicon film, and then, silicidation and diffusion of the aluminum are carried out by one-time heat treatment. But the following method may be used. That is, the silicidation is carried out by the heat treatment, thereafter, aluminum is introduced into the metal silicide gate electrode and the aluminum is diffused by carrying out the heat treatment again. according to the former method, it finish with one-time heat treatment, therefore, the process is simplified (reducing the number of step). On the other hand, according to the latter method, the heat treatment for the silicidation and the heat treatment for diffusing aluminum are easily optimized.

By the way, as a method for controlling each threshold voltage (Vthn, Vthp) of n-channel and p-channel MOS transistors, there is a method in which a ratio of metal and silicon included in the metal silicide gate electrode is controlled. However, according to the method, it is difficult to reduce both |Vthn| and |Vthp|. Moreover, in the case where each threshold voltage of n-channel and p-channel MOS transistors of a CMOS is controlled by using the method, it needs applying the method to each of n-channel and p-channel MOS transistors. That is, the method is repeated two times. Therefore, a problem that increases the number of step comes out. On the contrary, the present embodiment has no problem that the number of step increases like the conventional method.

Third Embodiment

FIGS. 15 to 20 are cross-sectional views showing a method for manufacturing a semiconductor device according to a third embodiment.

Figure 2:
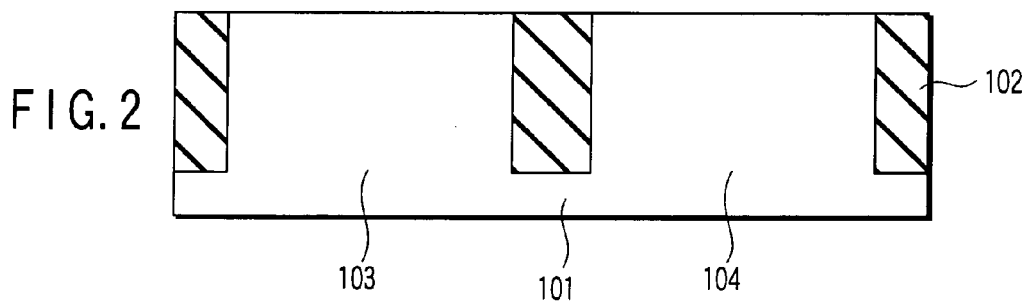
FIG. 2 is a cross-sectional view showing a method for manufacturing the semiconductor device according to a second embodiment.
Figure 3:
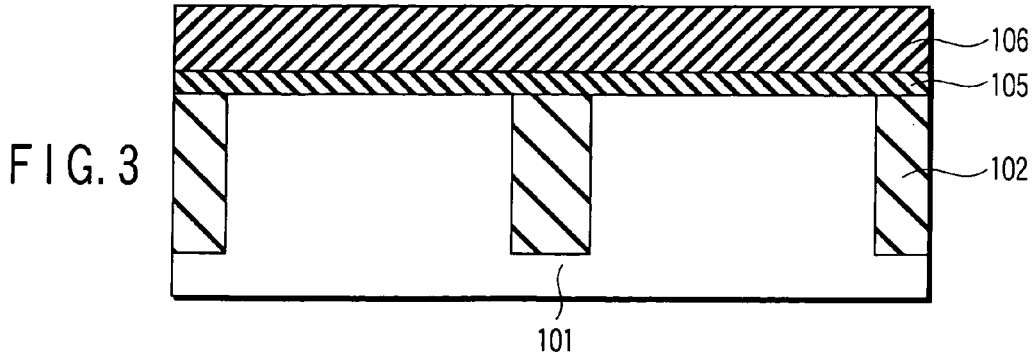
FIG. 3 is a cross-sectional view showing the method for manufacturing the semiconductor device according to the second embodiment following FIG. 2.
Figure 4:
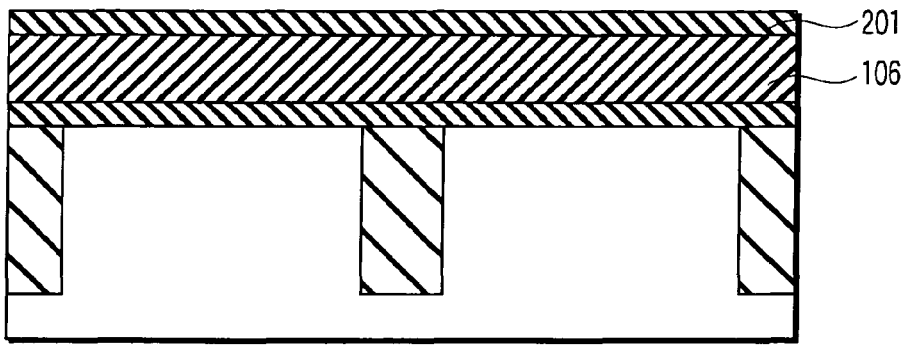
FIG. 4 is a cross-sectional view showing the method for manufacturing the semiconductor device according to the second embodiment following FIG. 3.
Figure 5:
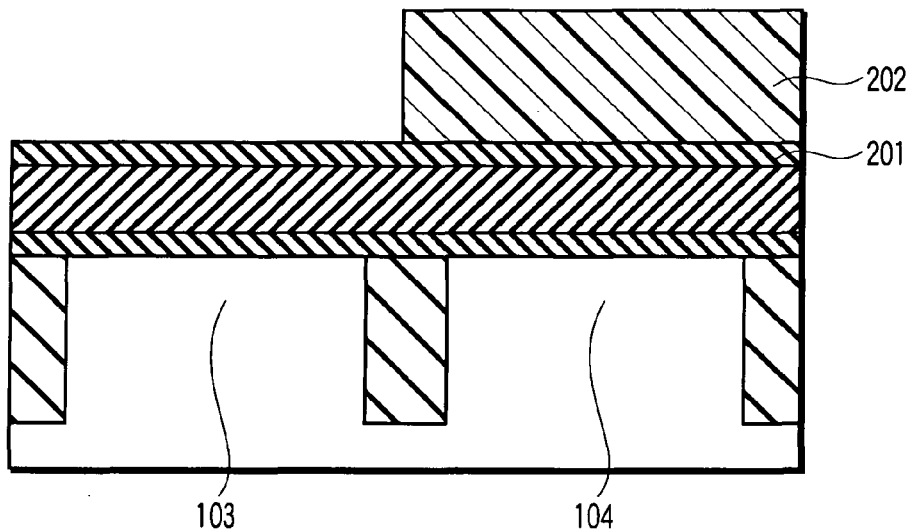
FIG. 5 is a cross-sectional view showing the method for manufacturing the semiconductor device according to the second embodiment following FIG. 4.
Figure 6:
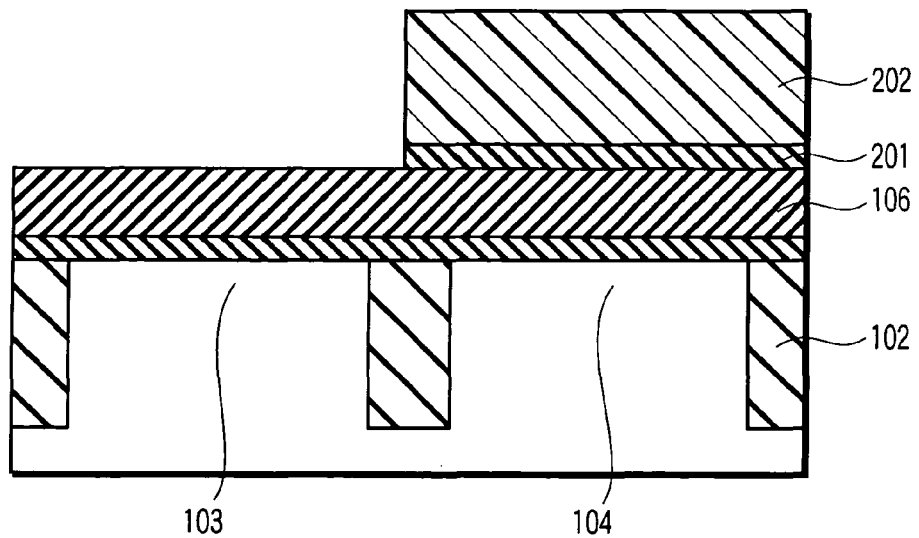
FIG. 6 is a cross-sectional view showing a method for manufacturing the semiconductor device according to the second embodiment following FIG. 5.
Figure 15:
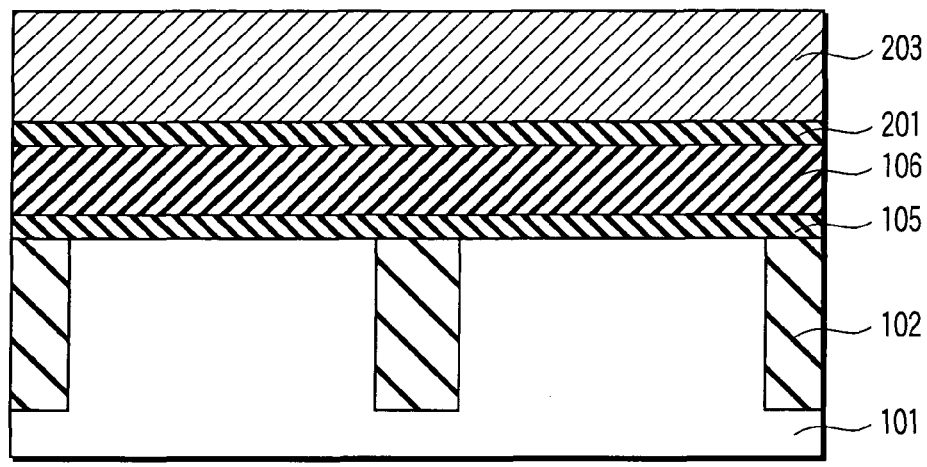
FIG. 15 is a cross-sectional view showing a semiconductor device according to a third embodiment.
Figure 16:
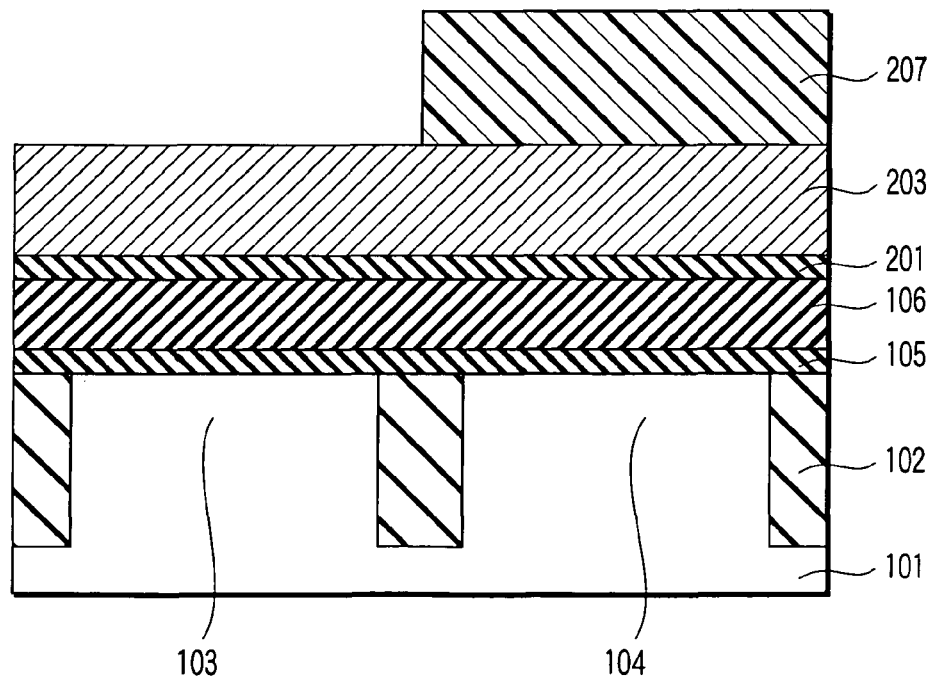
FIG. 16 is a cross-sectional view showing the method for manufacturing the semiconductor device according to the third embodiment following FIG. 15.
Figure 17:
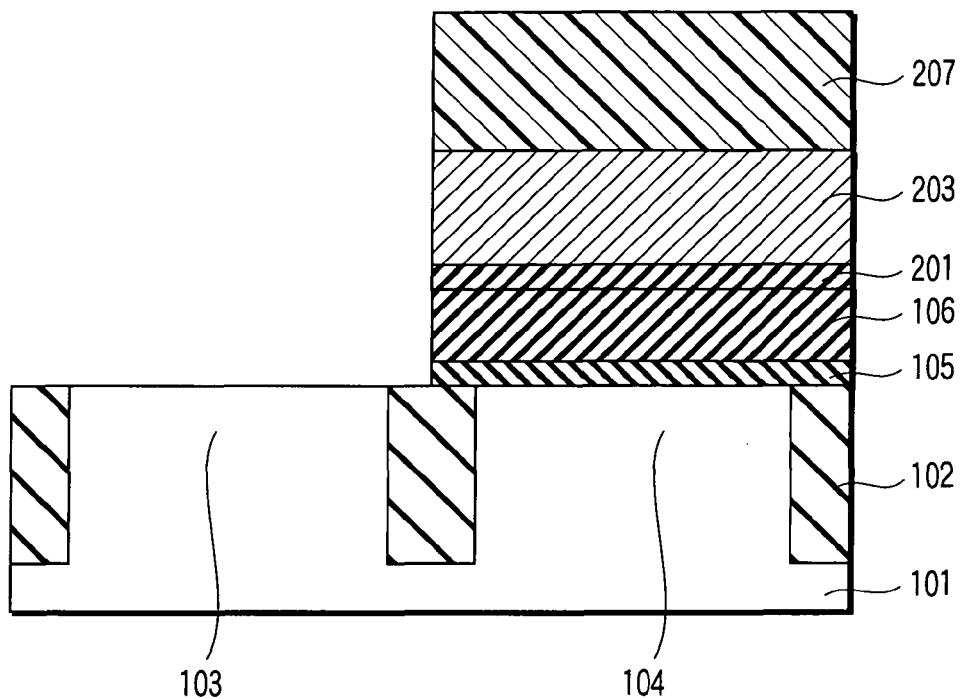
FIG. 17 is a cross-sectional view showing the method for manufacturing the semiconductor device according to the third embodiment following FIG. 16.
Figure 18:
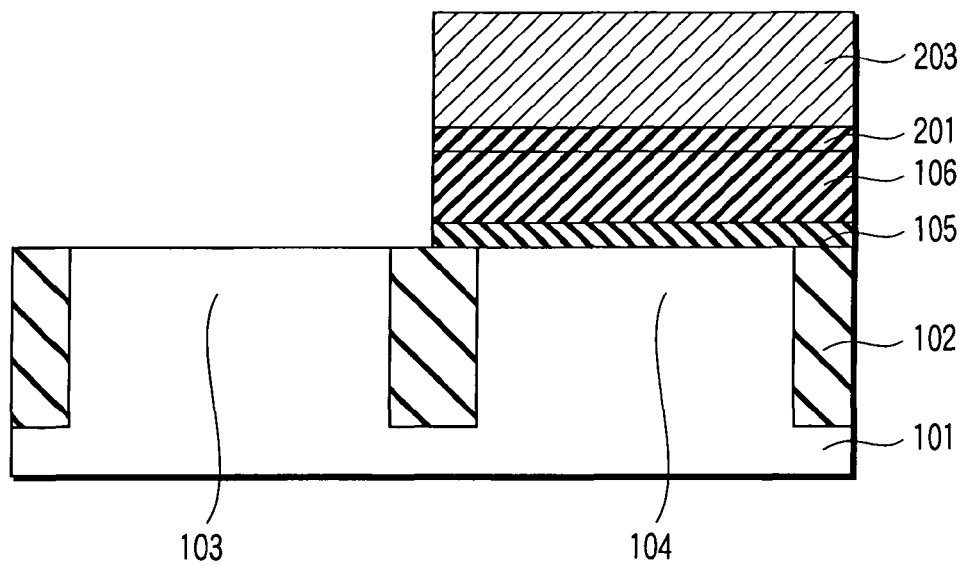
FIG. 18 is a cross-sectional view showing the method for manufacturing the semiconductor device according to the third embodiment following FIG. 17.
Figure 19:
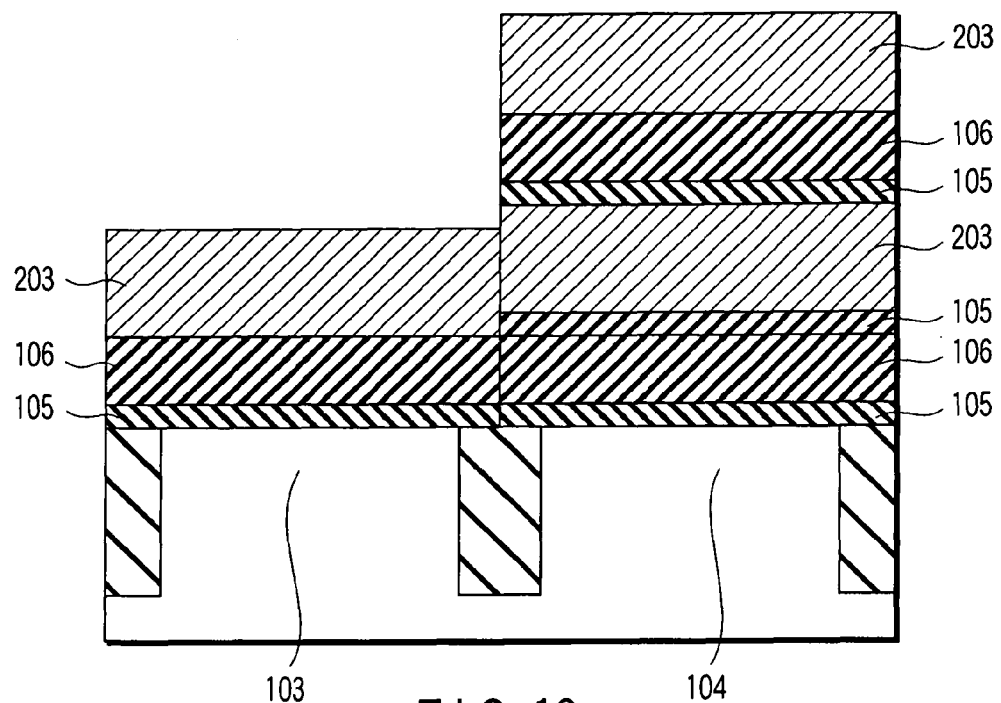
FIG. 19 is a cross-sectional view showing the method for manufacturing the semiconductor device according to the third embodiment following FIG. 18.

First, the steps from FIG. 2 to FIG. 4 are carried out.
[FIG. 15]
A polycrystalline silicon film 203 (first polycrystalline silicon film 203) is formed on a silicon oxide film 201.
[FIG. 16]
A resist pattern 207 covering the polycrystalline silicon film 203 in the pMOS region 104 is formed. The polycrystalline silicon film 203 in an nMOS region 104 is not covered with the resist pattern 207. Such the resist pattern 207 is obtained by applying resist on the entire surface of the polycrystalline silicon film 203, and removing the resist in the nMOS region 103 by exposure and development, for instance.
[FIG. 17]
By etching using the resist pattern 207 as a mask, the polycrystalline silicon film 203, the silicon oxide film 201, the HfSiON film 106 (first HfSiON film) and the silicon oxide film 105 (first silicon oxide film 105) in the nMOS region 103 are selectively removed.
[FIG. 18]
The resist pattern 207 is removed. Thereafter, the surface of the silicon substrate 101 is cleaned using dilute hydrofluoric acid.
[FIG. 19]
By heat treatment in an oxygen atmosphere at 800 to 900° C., a second silicon oxide film 105 having a thickness of 0.6 to 1.0 nm is formed on the silicon substrate 101 in the nMOS region 103 and the polycrystalline silicon film 203 in the pMOS region 104.

By MOCVD process, a HfSiO film not shown is formed on the second silicon film 105. An example of conditions for forming the HfSiO film is as follows. Substrate temperature: 500 to 600° C., Source gas: gas including TDMAS, TDEAH and oxygen. According to the conditions, a HfSiO film having Hf of 50% and a thickness of 3 nm is obtained. The HfSiO film may be formed as a sidewall of a stacked layer film formed in the pMOS region 104.

The HfSiO film is heated at temperature of 200 to 400° C., further the HfSiO film is exposed in mixed plasma of Ar and $N_2$. Thereby, nitrogen is introduced into the HfSiO film. The introduction amount of the nitrogen is 10 to 20 atom %, for example. Thereafter, in order to recover from the plasma damage, RTA is carried out in a nitrogen atmosphere at 800 to 1000° C. for 10 to 30 second, a second HfSiON film 106 is obtained. The second HfSiON film 106 may be formed as a sidewall of a stacked layer film formed in the pMOS region 104.

Figure 20:
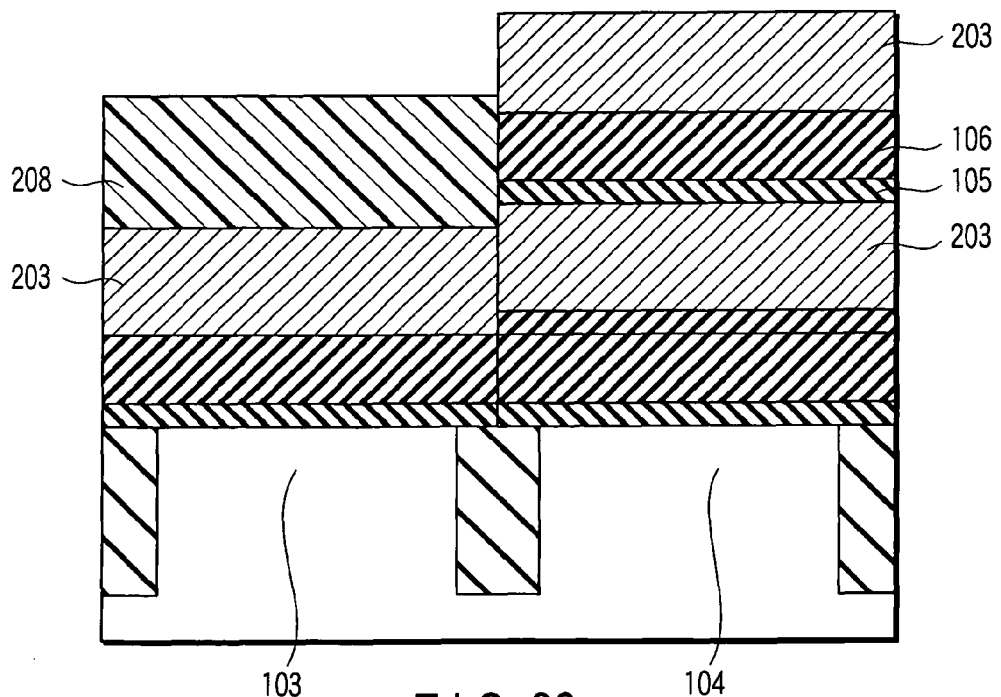
FIG. 20 is a cross-sectional view showing the method for manufacturing the semiconductor device according to the third embodiment following FIG. 19.

A second polycrystalline silicon film 203 is formed on the second HfSiON film 106.
[FIG. 20]
A resist pattern 208 covering the second polycrystalline silicon film 203 in the nMOS region 103 is formed. The second polycrystalline silicon film 203 in the pMOS region 104 is not covered with the resist pattern 208.

Next, by etching using the resist pattern 208 as a mask, the second polycrystalline silicon film 203, the second HfSiON film 106 and the second silicon oxide film 105 in the pMOS region 104 are selectively removed, therefore, the resist pattern 208 is removed.

Figure 7:
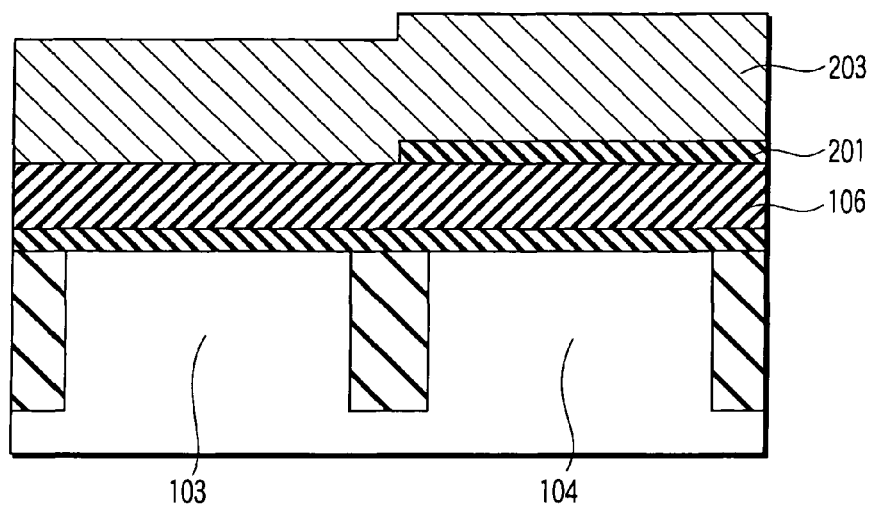
FIG. 7 is a cross-sectional view showing the method for manufacturing the semiconductor device according to the second embodiment following FIG. 6.
Figure 8:
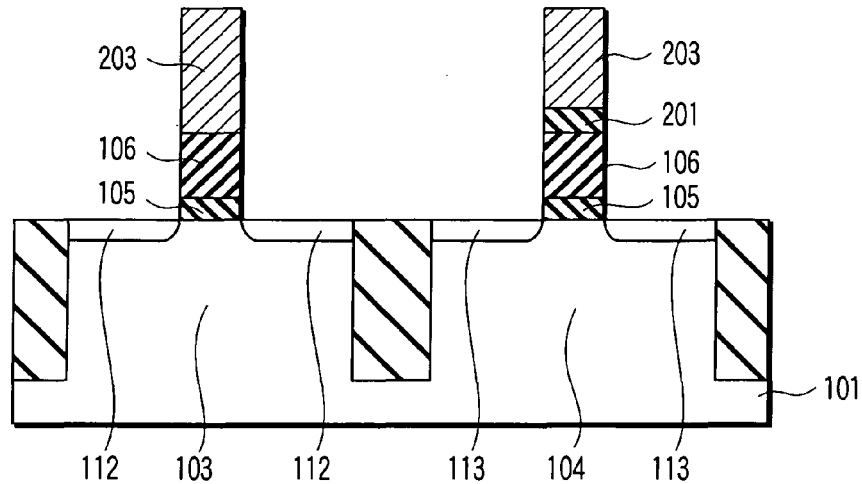
FIG. 8 is a cross-sectional view showing the method for manufacturing the semiconductor device according to the second embodiment following FIG. 3.
Figure 9:
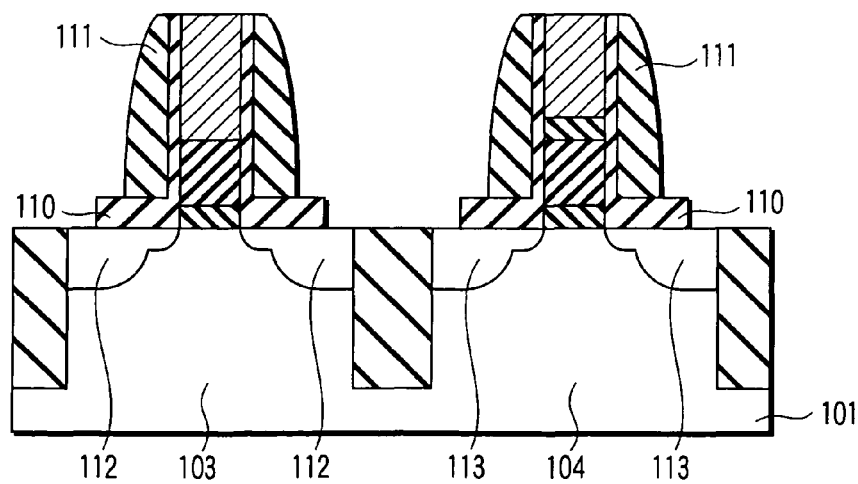
FIG. 9 is a cross-sectional view showing the method for manufacturing the semiconductor device according to the second embodiment following FIG. 8.
Figure 10:
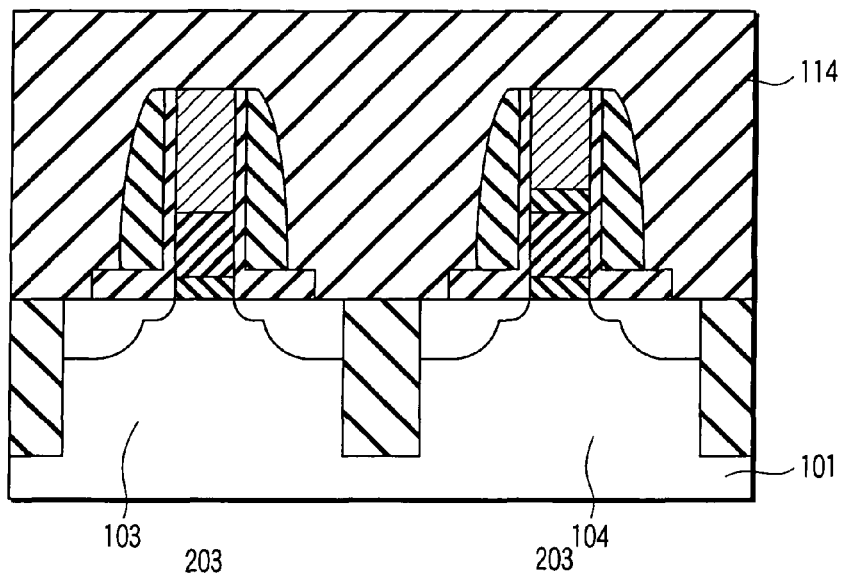
FIG. 10 is a cross-sectional view showing a method for manufacturing the semiconductor device according to the second embodiment following FIG. 9.
Figure 11:
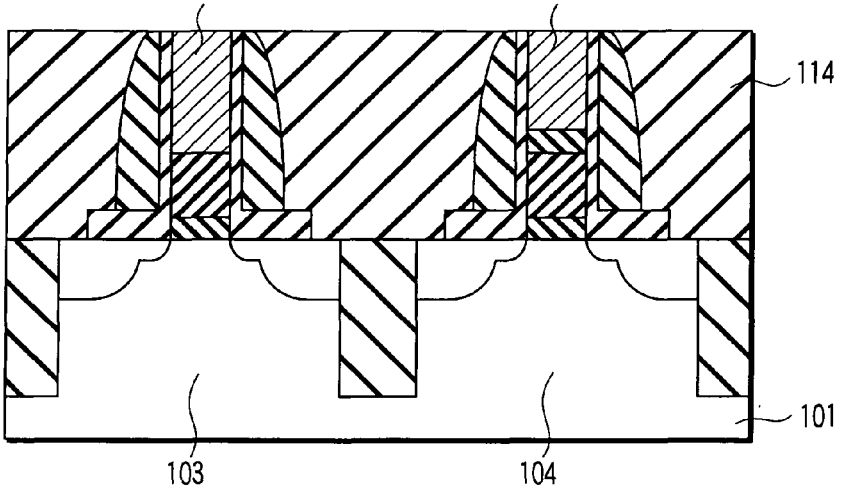
FIG. 11 is a cross-sectional view showing the method for manufacturing the semiconductor device according to the second embodiment following FIG. 10.
Figure 12:
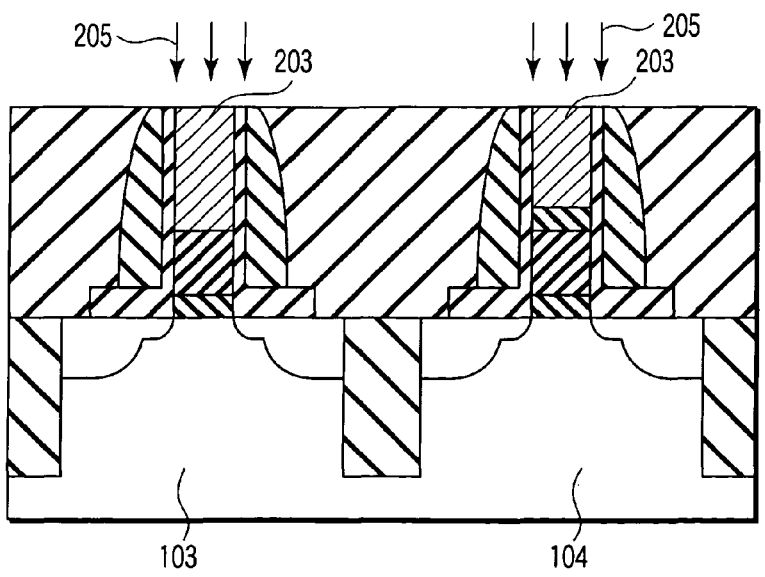
FIG. 12 is a cross-sectional view showing the method for manufacturing the semiconductor device according to the second embodiment following FIG. 11.
Figure 13:
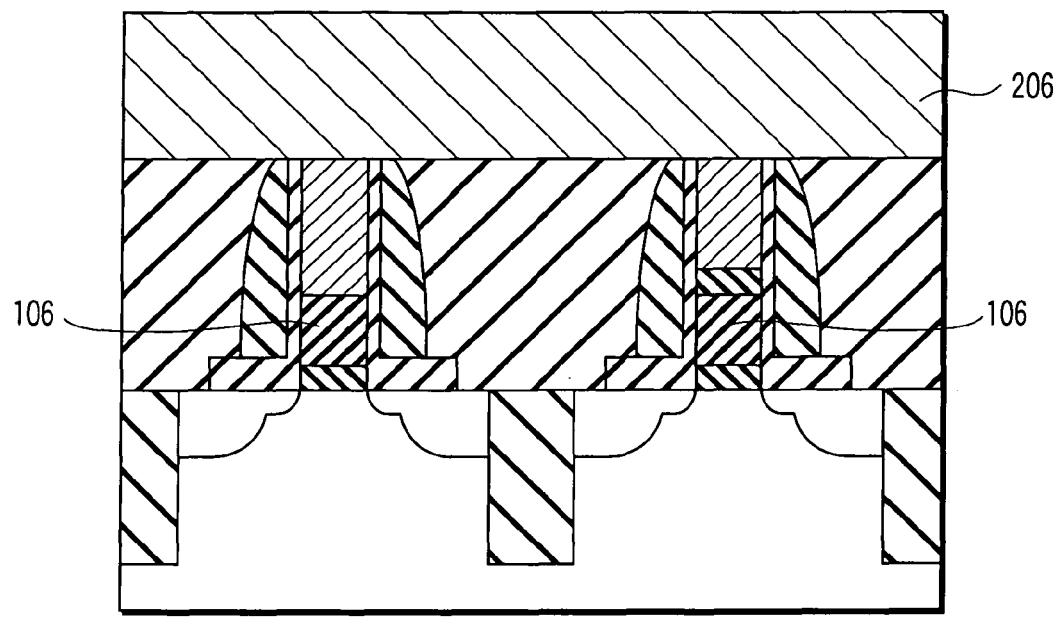
FIG. 13 is a cross-sectional view showing the method for manufacturing the semiconductor device according to the second embodiment following FIG. 12.

As a result, the structure shown in FIG. 7 described in the first embodiment is obtained. Thereafter, the same process as the first embodiment is carried out. In addition the same modification example as the first embodiment may be given (i.e., heat treatment for silicidation and heat treatment for diffusion of aluminum are independently carried out.)

In the third embodiment, the gate dielectric film and the like in the pMOS region is formed in first, but the same effect is obtained by forming them in nMOS region in first.

Fourth Embodiment

FIGS. 21 to 27 are cross-sectional views showing a method for manufacturing a semiconductor device according to a fourth embodiment.

Figure 21:
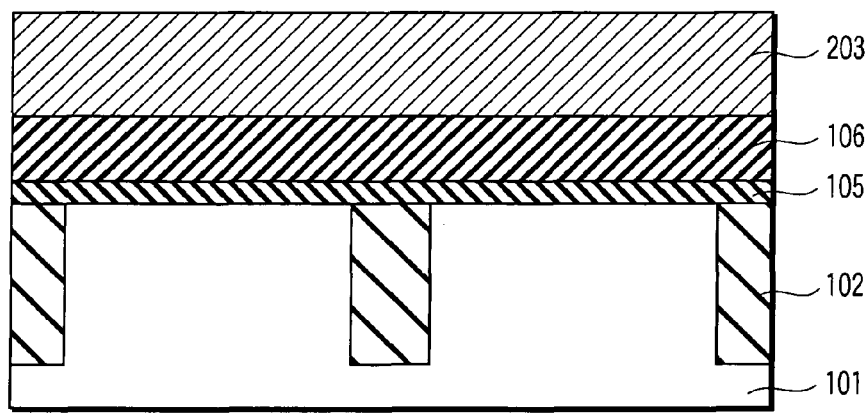
FIG. 21 is a cross-sectional view showing a method for manufacturing a semiconductor device according to a fourth embodiment.
Figure 22:
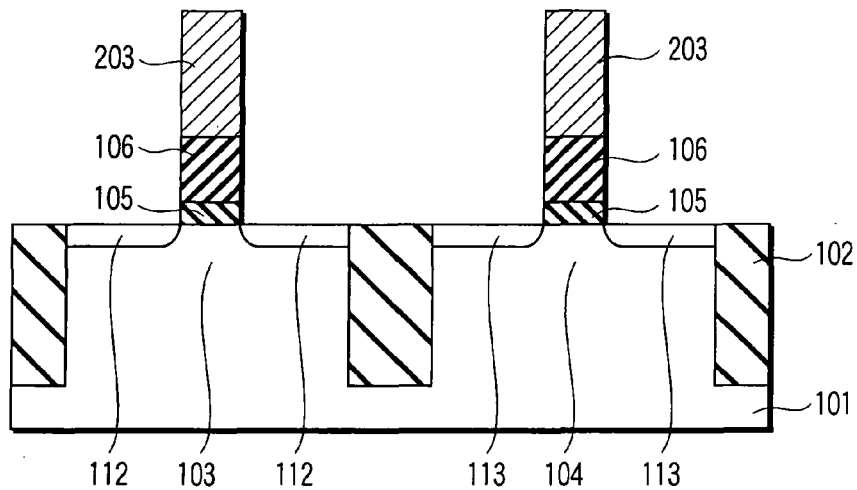
FIG. 22 is a cross-sectional view showing the method for manufacturing the semiconductor device according to the fourth embodiment following FIG. 21.
Figure 23:
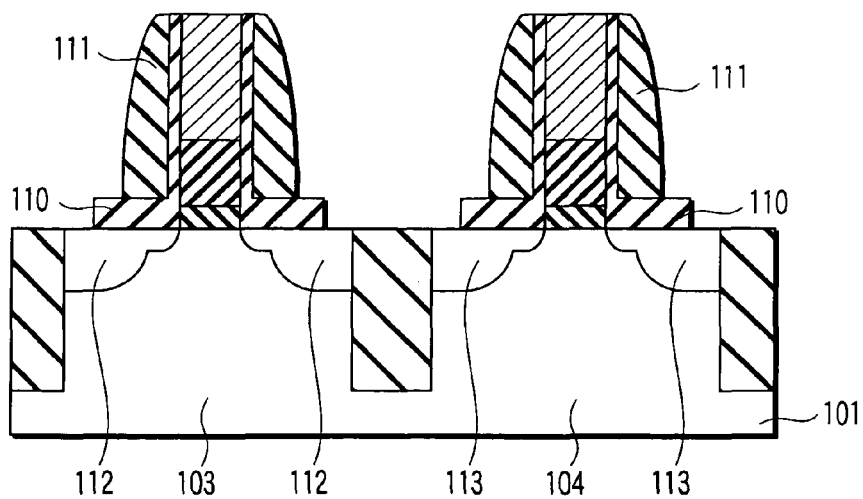
FIG. 23 is a cross-sectional view showing the method for manufacturing the semiconductor device according to the fourth embodiment following FIG. 22.

First, the steps from FIG. 2 to FIG. 3 are carried out.
[FIG. 21]
A polycrystalline silicon film 203 is formed on an HfSiON film 106 by CVD process. An example of conditions for forming the polycrystalline silicon 203 is as follows. Temperature: 600° C., Atmosphere (source gas): $SiH_4$. The polycrystalline silicon film 203 has a thickness of 150 nm, for example.
[FIG. 22]
The polycrystalline silicon film 203, the HfSiON film 106 and the silicon oxide film 105 are successively etched using a mask not shown to perform a gate processing. Extensions of source/drain regions 112 and 113 are formed by ion implantation and annealing.
[FIG. 23]
A first spacer 110, a second spacer 111 and the remaining portions of the source/drain regions 112 and 113 are formed.
[FIG. 24]
An interlayer dielectric 114 is formed on the entire surface to cover the first spacer 110, the second spacer 111 and the polycrystalline silicon film 203.

[FIG. 25]

The interlayer dielectric 114 is polished by CMP process, and thereby, an upper surface of the polycrystalline silicon films 203 is exposed.

[FIG. 26]

Aluminum ions 205 are implanted into the polycrystalline silicon films 203 in the nMOS and pMOS regions 103 and 104. The aluminum ions 205 are implanted from the exposed surface of the polycrystalline silicon film 203s to the inside thereof. An example of ion implantation conditions is as follows. Acceleration voltage: 30 keV, Dose: $1\times10^{15}$ atoms/cm$^2$.

Oxygen ions 209 are selectively implanted into the polycrystalline silicon film 203 in the pMOS region 104 using a mask not shown. An example of ion implantation conditions is as follows. Acceleration voltage: 30 keV, Dose: $1\times10^{15}$ atoms/cm$^2$.

Conversely, ion implantation may be carried out in the order of oxygen ions 209, aluminum ions 205.

[FIG. 27]

A nickel (Ni) film 206 is formed on the entire surface (region including the polycrystalline silicon film 203). The nickel film 206 is formed by sputtering process, for example. The nickel film 206 has a thickness of 150 nm, for example.

Figure 14:
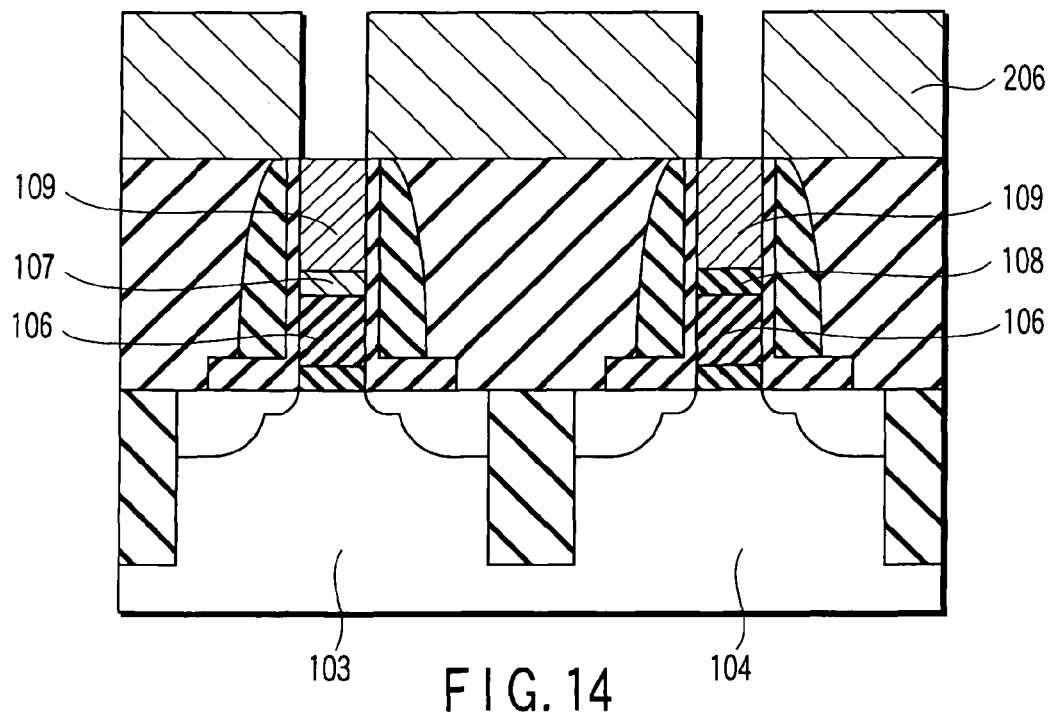
FIG. 14 is a cross-sectional view showing the method for manufacturing the semiconductor device according to the second embodiment following FIG. 13.

Next, by heat treatment, for example, heat treatment at temperature of 300 to 400° C. for 30 to 60 minutes, a silicide reaction between the polycrystalline silicon film 203 and the nickel film 206 is made, thereby the structure shown in FIG. 14 of the first embodiment (aluminum film 107 including small amount of oxygen, nickel silicide gate electrode 109, AlO film 108) is obtained.

At this time, an aluminum film 107 including small amount of oxygen is formed on the HfSiON film 106 of the nMOS region 103 by the same mechanism as the second embodiment.

However, an AlO film 108 is formed on the HfSiON film 106 of the PMOS region 104 by the mechanism different from the second embodiment. The different point will be hereinafter described.

The aluminum in the polycrystalline silicon film 203 is precipitated between the nickel silicide gate electrode 109 and the HfSiON film 106 by diffusion. The precipitated aluminum reacts with oxygen in the polycrystalline silicon film 203 introduced by ion implantation in the pMOS region 104. As a result, the AlO film 108 is formed on the HfSiON film 106 of the PMOS region 104. In the present embodiment, the AlO film 108 may includes a silicon oxide or may not include it.

Thereafter, as in the second embodiment, the semiconductor device shown in FIG. 1 is obtained through known process such as removing the surplus nickel film by sulfate hydrogen peroxide.

In the present embodiment, aluminum (nMOS), aluminum and oxygen (pMOS) are implanted into the silicon, and then, silicidation and diffusion of the aluminum and oxygen are carried out by one-time heat treatment. But the following method may be used. That is, the silicidation is carried out by the heat treatment, thereafter, aluminum (nMOS), aluminum and oxygen (pMOS) are introduced into the metal silicide gate electrode and the aluminum and oxygen are diffused by carrying out the heat treatment again. according to the former method, it finish with one-time heat treatment, therefore, the process is simplified (reducing the number of step). On the other hand, according to the latter method, the heat treatment for the silicidation and the heat treatment for diffusing aluminum are easily optimized.

Fifth Embodiment

Figure 28:
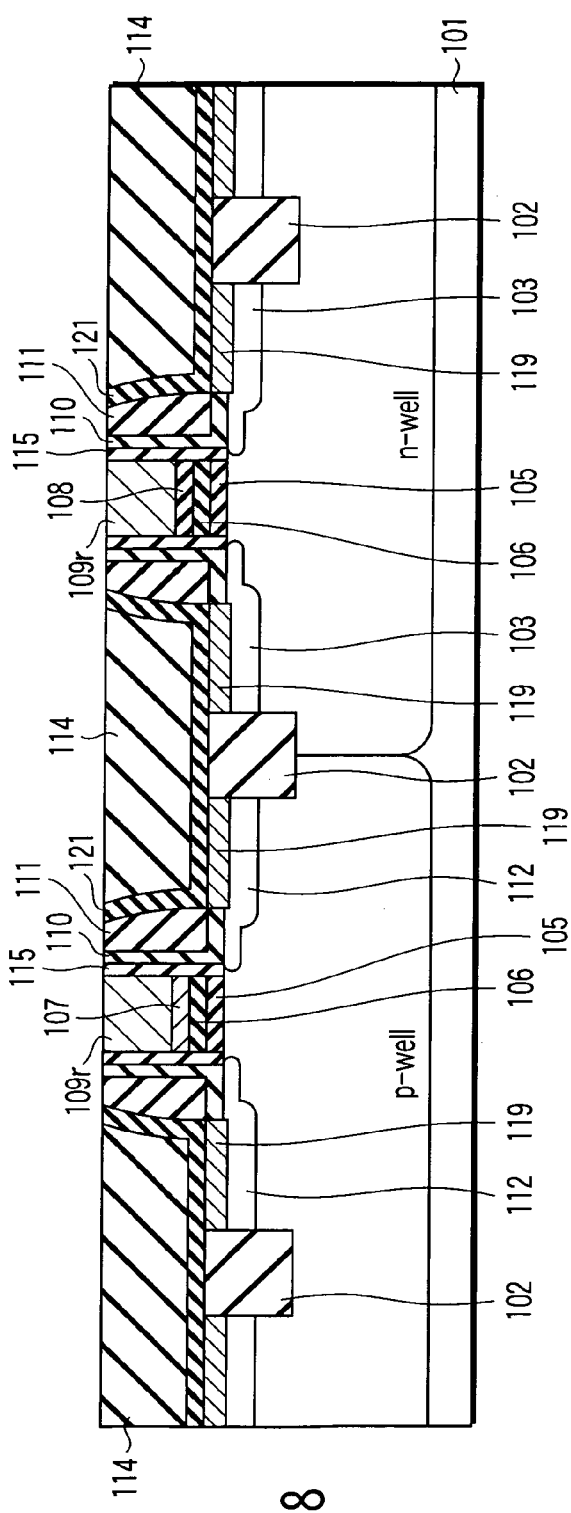
FIG. 28 is a cross-sectional view showing a semiconductor device according to a fifth embodiment.
Figure 29:
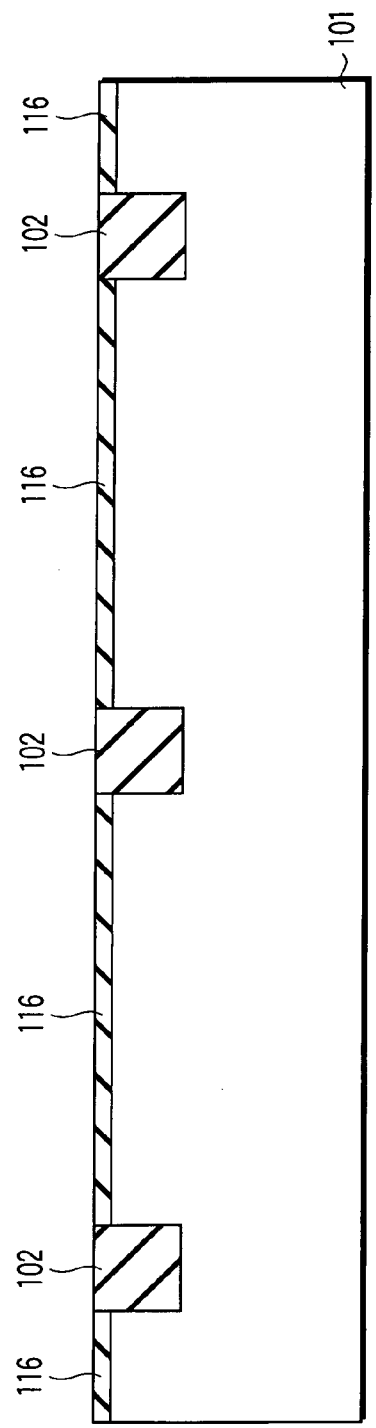
FIG. 29 is a cross-sectional view showing the method for manufacturing the semiconductor device according to the fifth embodiment.

FIG. 28 is a cross-sectional view showing a semiconductor device according to a fifth embodiment of the present invention.

In the present embodiment, a Ni-rich nickel silicide gate electrode 109r is used as each gate electrode of p-channel and n-channel MOS transistors. The nickel silicide gate electrode 109r comprises a Ni$_2$Si film or Ni$_3$Si film, for example. The nickel silicide gate electrode 109r may comprise a nickel silicide film mixing Ni$_2$Si and Ni$_3$Si. In FIG. 28, 115 denotes a third spacer (offset spacer). In addition, the p-channel MOS transistor comprises a channel region including F, the n-channel MOS transistor comprises a channel region including N.

According to the present embodiment, as the p-channel MOS transistor comprises the AlO film 108 and the nickel silicide gate electrode 109r, the n-channel MOS transistor comprises the aluminum film 107 including small amount of oxygen and the nickel silicide gate electrode 109r, from the same reason as the first embodiment, the following advantage is obtained. that is, the CMOS having a low threshold voltage (|Vthn| and |Vthp|) is realized, which also realizes the thinning of electric film thickness by reduction which is the merit of adopting the silicide gate electrode and reduction of leakage current which is the merit of adopting the high dielectric constant gate dielectric film.

In addition, the p-channel MOS transistor comprises a channel region including F, the n-channel MOS transistor comprises a channel region including N, which also contribute to reduction of the threshold voltage. In order to obtain a LSTP (Low Standby Power) threshold voltage, it is realized without including F and N in the channel region.

FIGS. 29 to 42 are cross-sectional views showing a method for manufacturing the semiconductor device according to the fifth embodiment.

[FIG. 29]

A sacrificial oxide film 116 is formed on a surface of the silicon substrate 101, thereafter, the isolation dielectric film 102 is formed.

[FIG. 30]

A resist 210 covering an nMOS region 103 is formed. By ion implantation using the resist 210 as a mask, P (phosphorous) ions 211 are implanted into the surface of substrate in the pMOS region 104. The ion implantation is carried out for the purpose of forming a diffusion layer (n-well) and controlling the threshold voltage of a transistor, and the ion implantation is carried out several times. In addition, ion implantation of B (boron) or In (indium) ions may be carried out for the purpose of fine control of the threshold voltage.

After the ion implantation of P 211, in order to form a channel region including F in the substrate surface of the pMOS region 104, by ion implantation using the resist 210, F (fluorine) ions not shown are implanted into the substrate surface of the pMOS region 104. If low threshold voltage is not required, the F ion implantation may not be carried out.

[FIG. 31]

The resist 210 is removed, a resist 212 covering the PMOS region 104 is formed. B ions 213 are implanted into the substrate surface of the nMOS region 103 by ion implantation using the resist 212 as a mask. The ion implantation is carried out for the purpose of forming a diffusion layer (p-well) and controlling the threshold voltage of the transistor, and the ion implantation is carried out several times. In addition, ion implantation of As (arsenic) or P ions may be carried out for the purpose of fine control of the threshold voltage.

After the ion implantation of B 213, in order to form a channel region including N in the substrate surface of the nMOS region 103, N (nitrogen) ions not shown are implanted into the substrate surface of the nMOS region 103 using the resist as a mask. If low threshold voltage is not required, the N ion implantation may not be carried out.

[FIG. 32]

Figure 30:
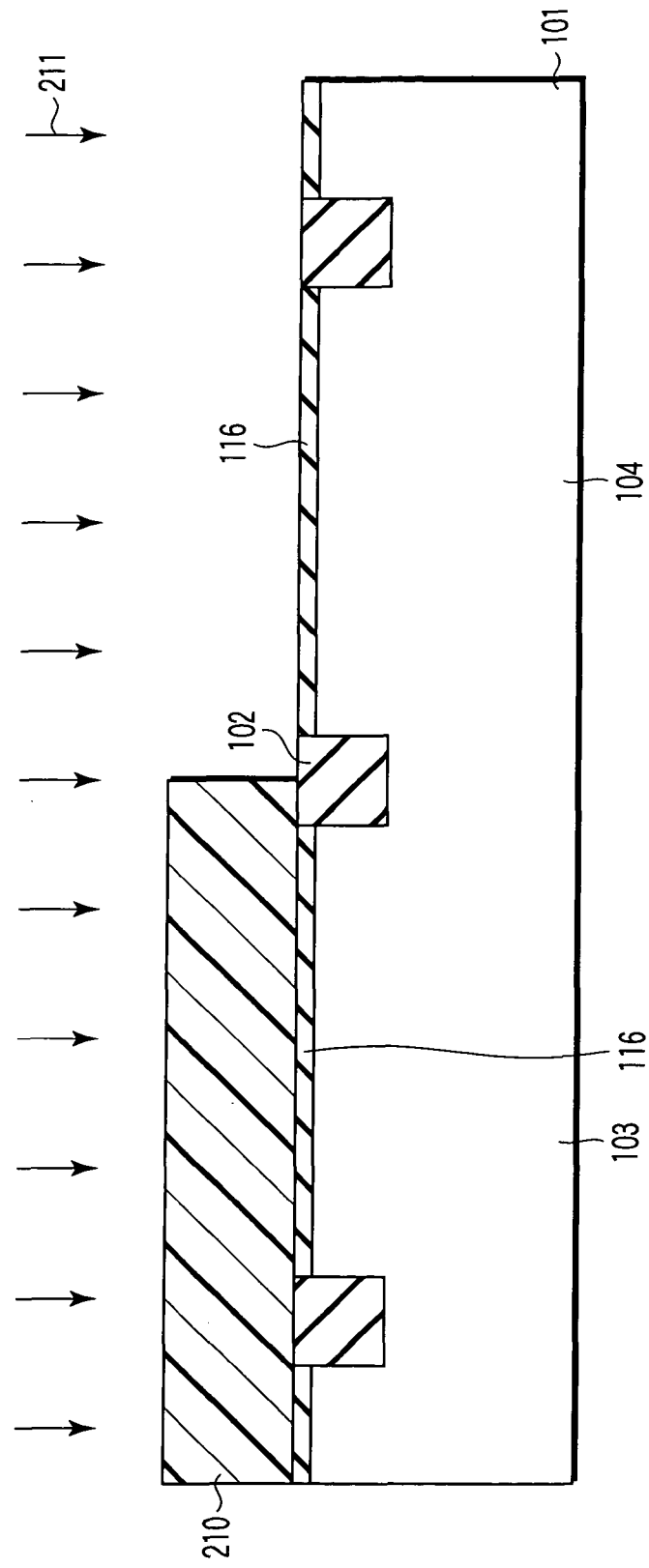
FIG. 30 is a cross-sectional view showing the method for manufacturing the semiconductor device according to the fifth embodiment following FIG. 29.
Figure 31:
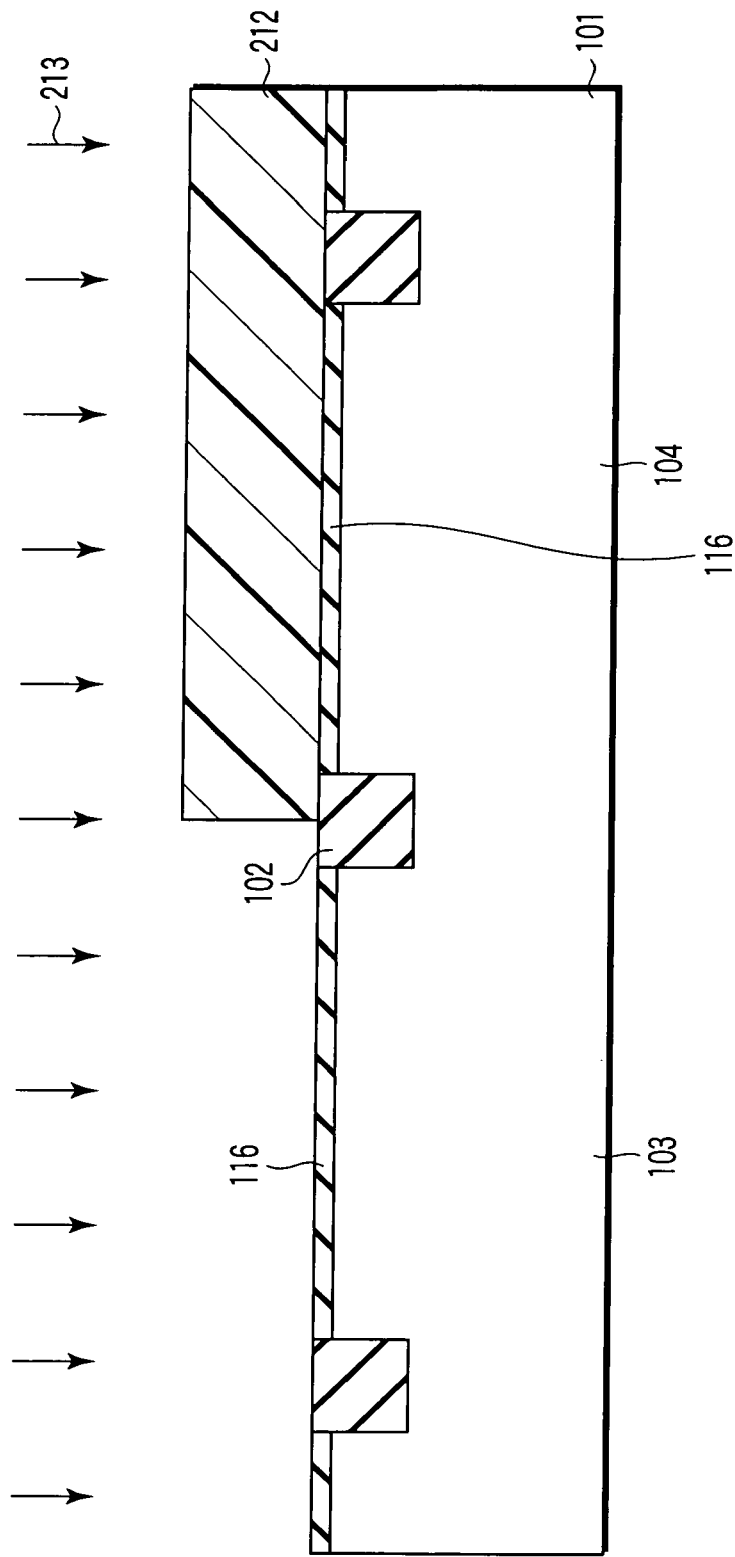
FIG. 31 is a cross-sectional view showing the method for manufacturing the semiconductor device according to the fifth embodiment following FIG. 30.
Figure 32:
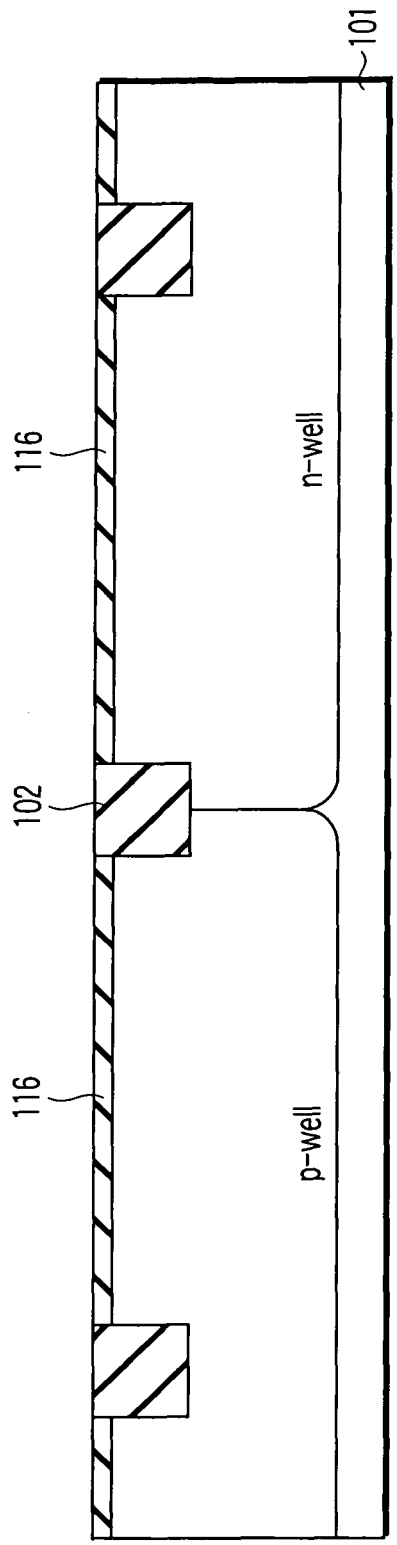
FIG. 32 is a cross-sectional view showing the method for manufacturing the semiconductor device according to the fifth embodiment following FIG. 31.
Figure 33:
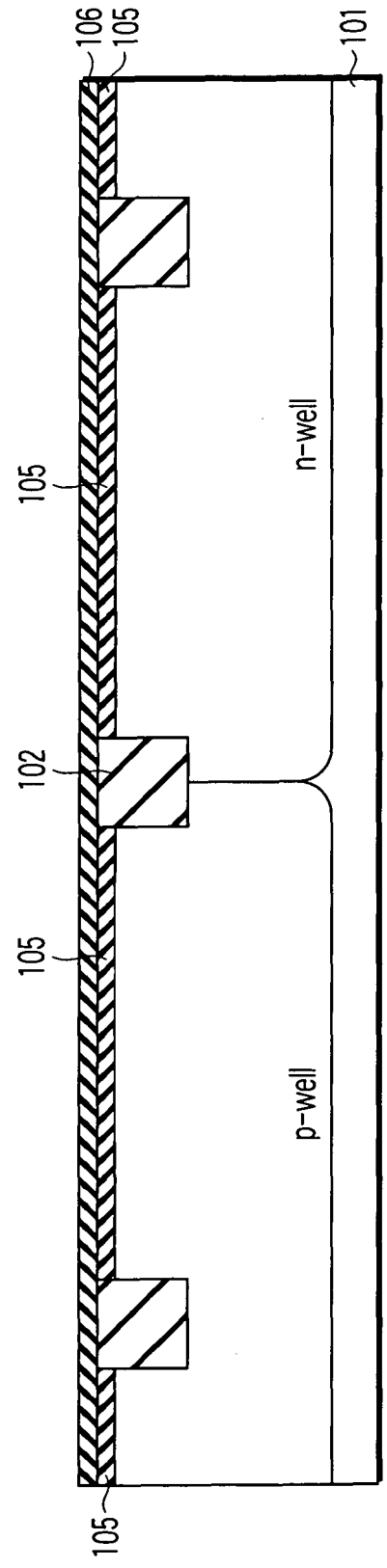
FIG. 33 is a cross-sectional view showing the method for manufacturing the semiconductor device according to the fifth embodiment following FIG. 32.
Figure 34:
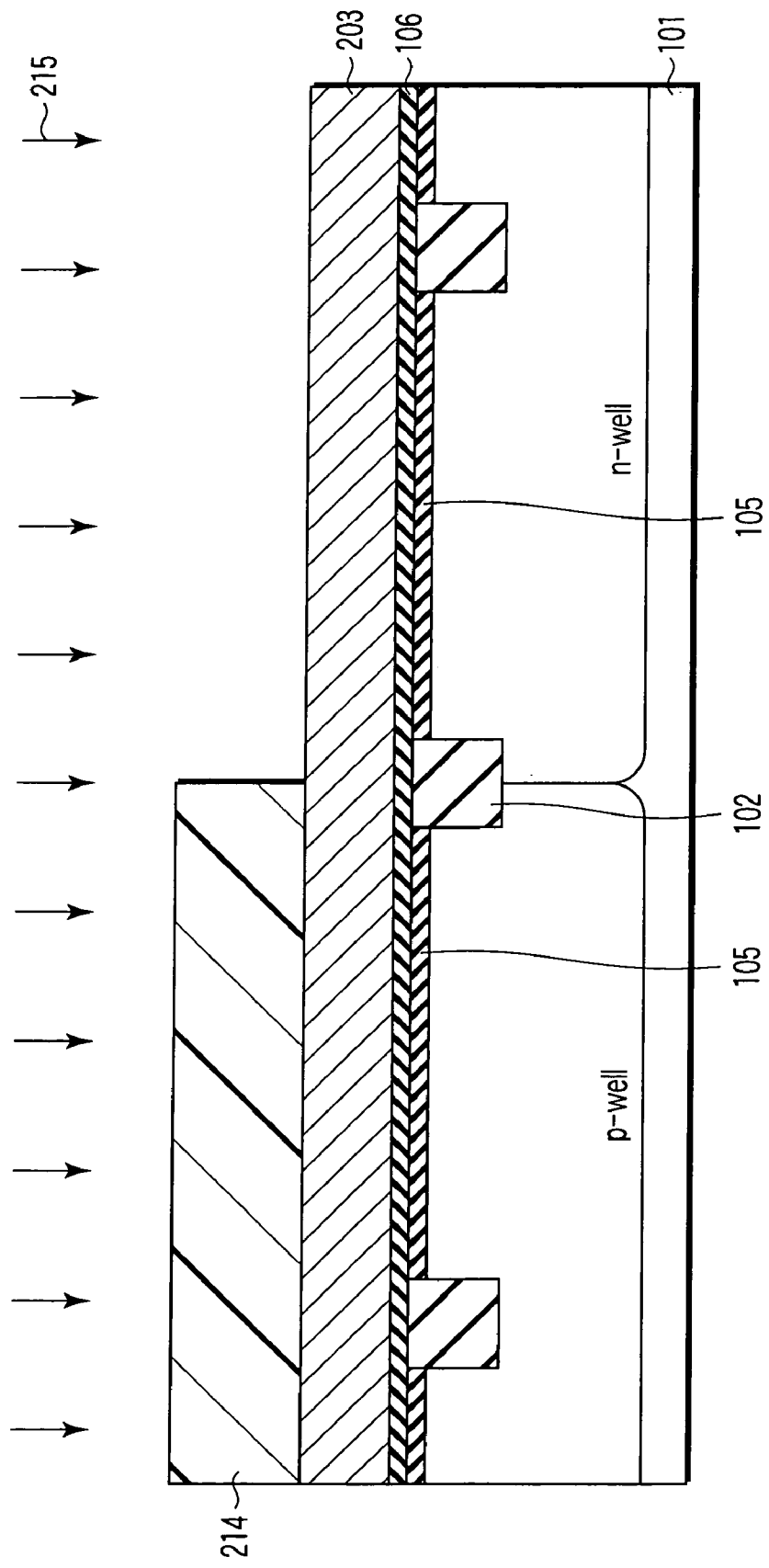
FIG. 34 is a cross-sectional view showing the method for manufacturing the semiconductor device according to the fifth embodiment following FIG. 33.
Figure 35:
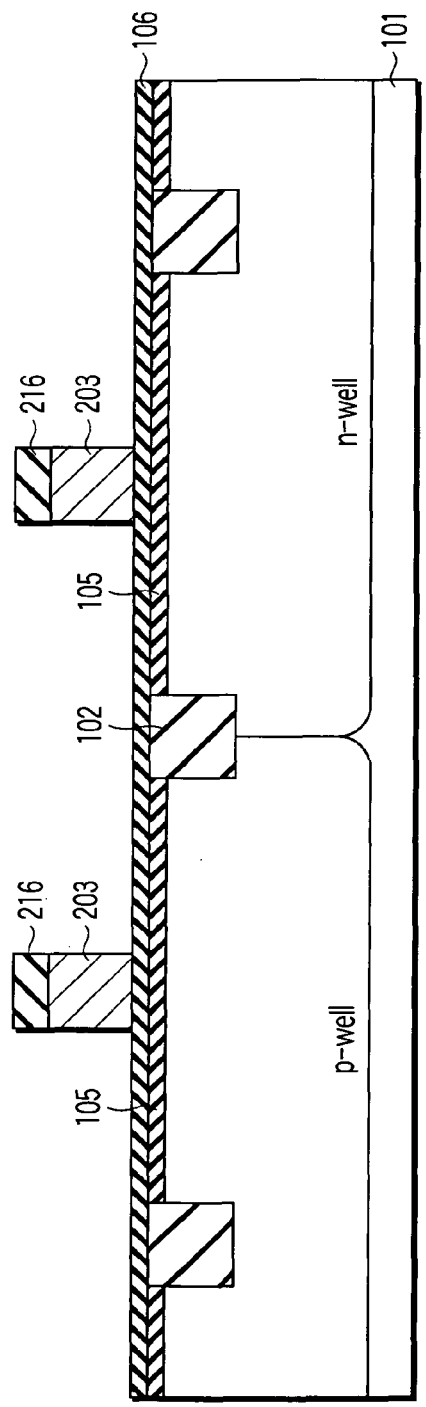
FIG. 35 is a cross-sectional view showing the method for manufacturing the semiconductor device according to the fifth embodiment following FIG. 34.
Figure 36:
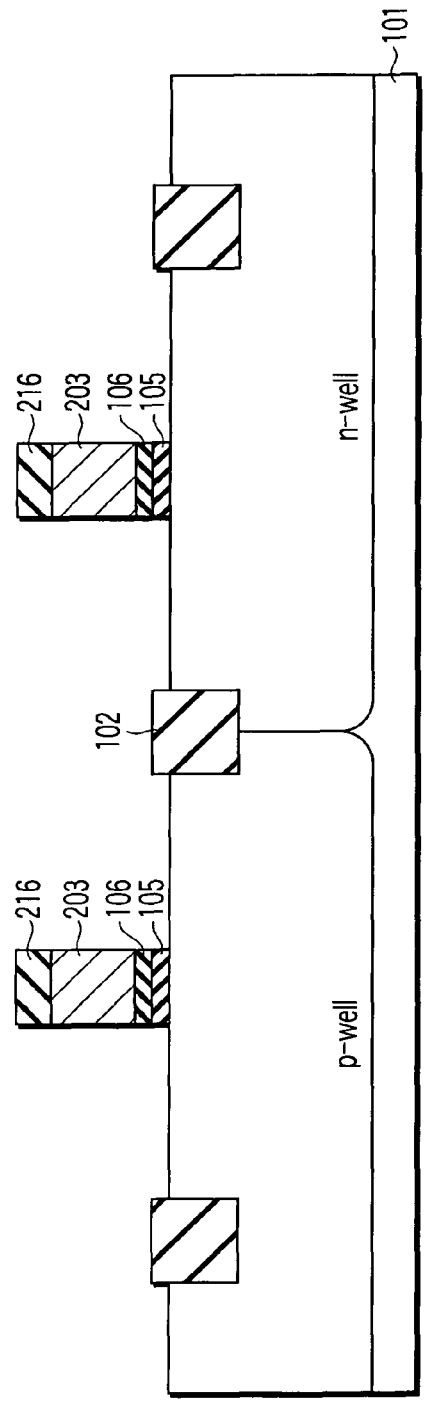
FIG. 36 is a cross-sectional view showing the method for manufacturing the semiconductor device according to the fifth embodiment following FIG. 35.
Figure 37:
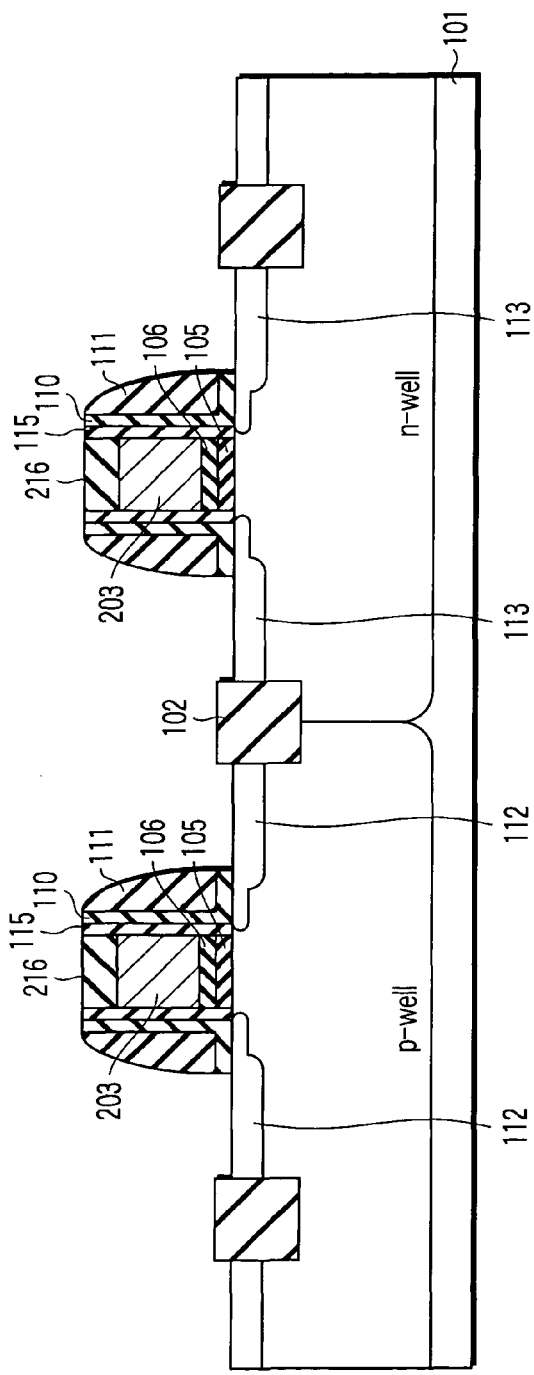
FIG. 37 is a cross-sectional view showing the method for manufacturing the semiconductor device according to the fifth embodiment following FIG. 36.
Figure 38:
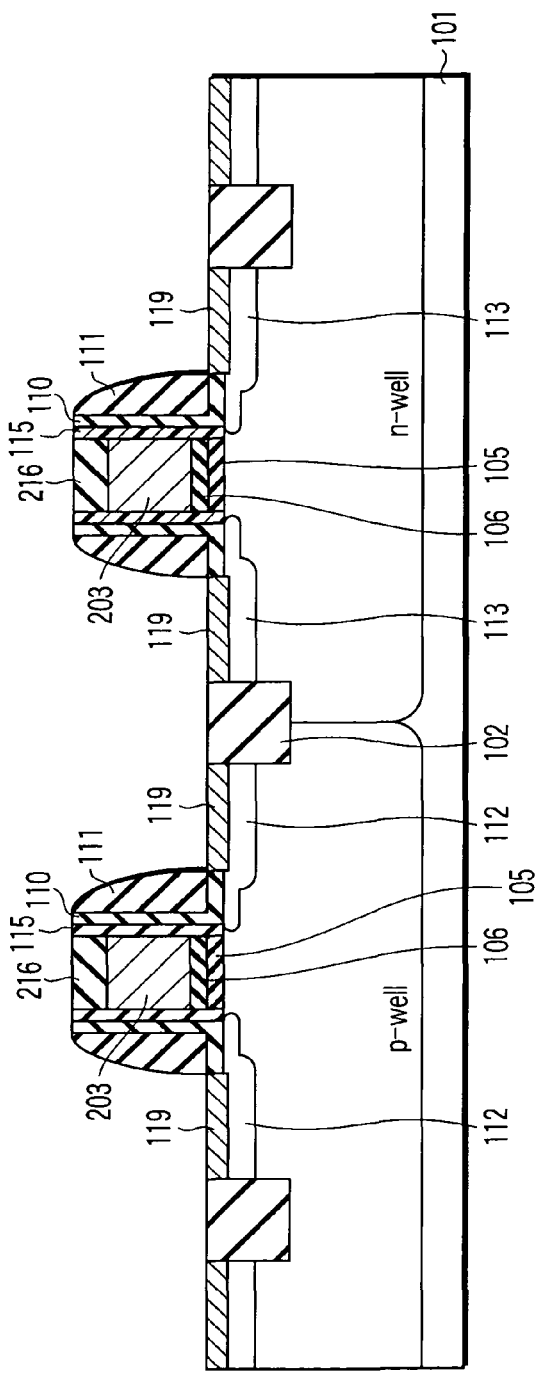
FIG. 38 is a cross-sectional view showing the method for manufacturing the semiconductor device according to the fifth embodiment following FIG. 37.
Figure 39:
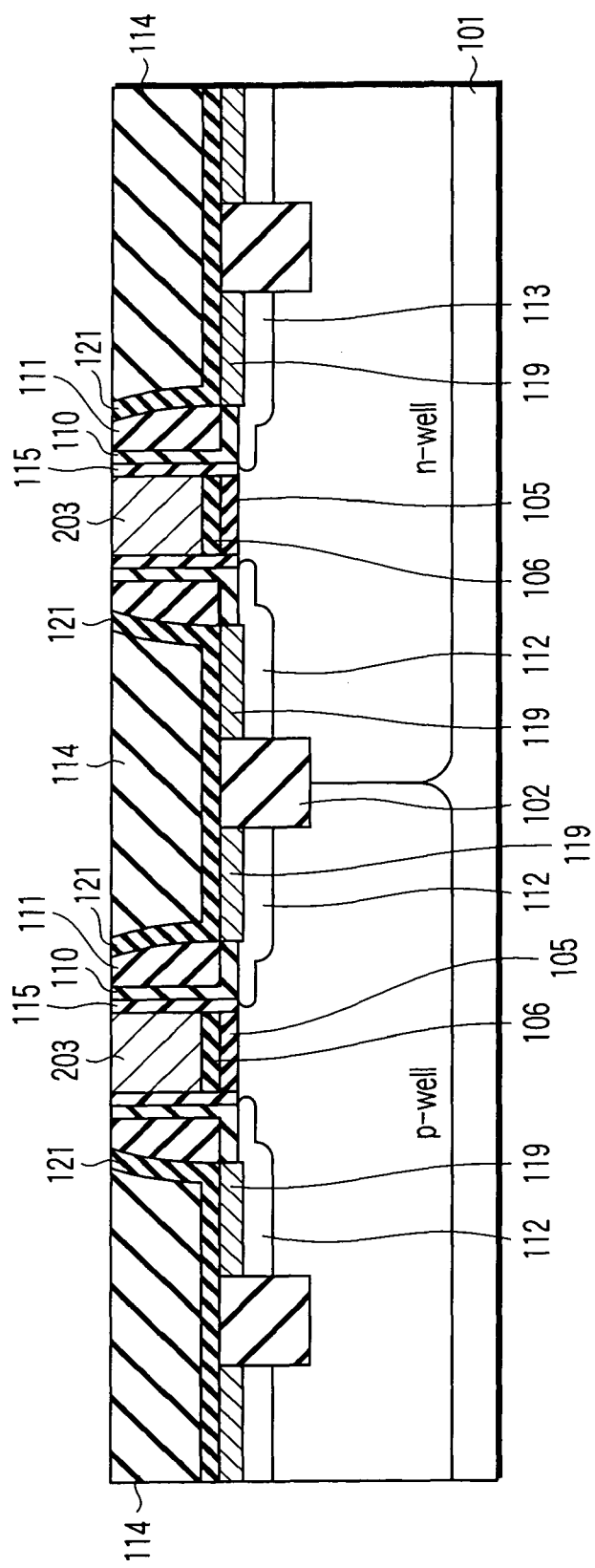
FIG. 39 is a cross-sectional view showing the method for manufacturing the semiconductor device according to the fifth embodiment following FIG. 38.
Figure 40:
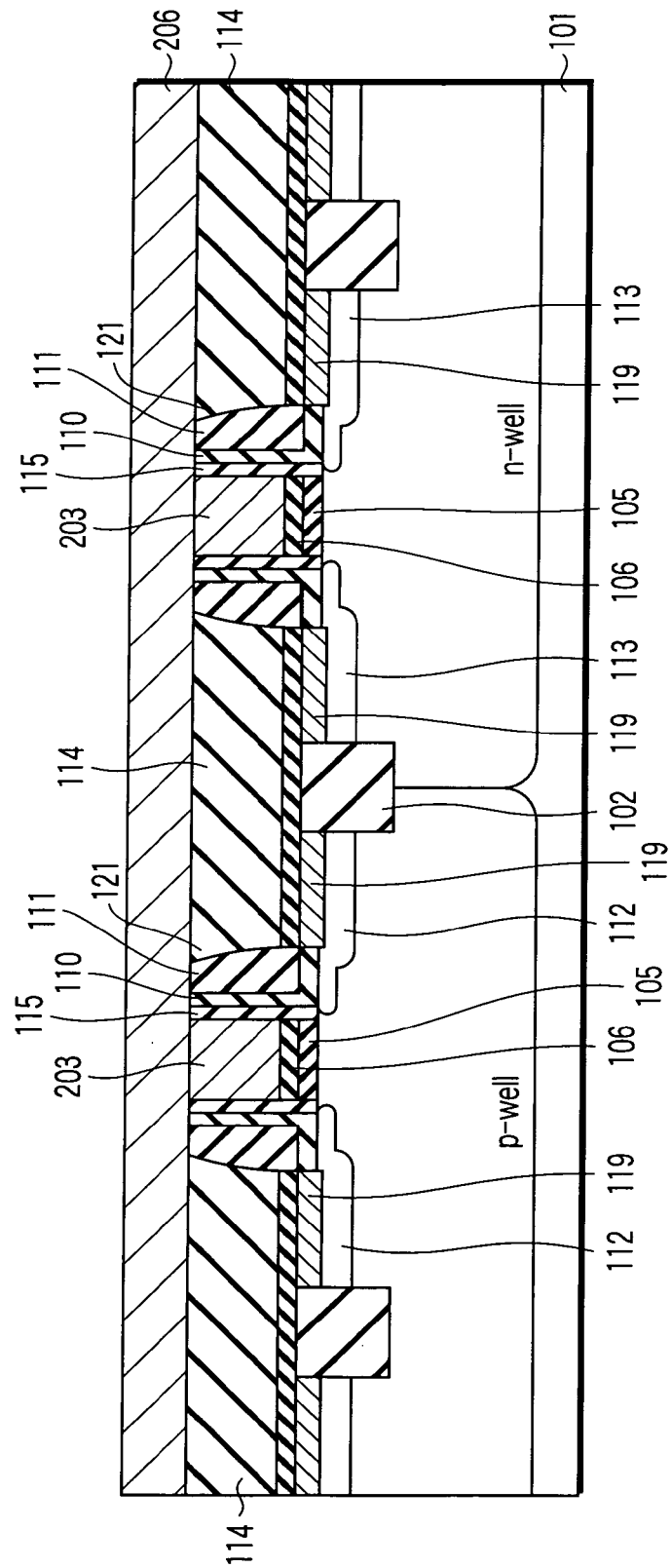
FIG. 40 is a cross-sectional view showing the method for manufacturing the semiconductor device according to the fifth embodiment following FIG. 39.

Annealing is carried out in order to activate various dopants implanted into the substrate surface in the steps of FIG. 30 and FIG. 31. As a result, diffusion layers (n-well, p-well) are formed, further, the channel region not shown including F and the channel region not shown including N are formed.

Here, the process of activating various dopants at one-time annealing is mentioned, but annealing may be carried out in each step of FIG. 30 and FIG. 31.

[FIG. 33]

The sacrificial oxide film 116 is removed using an NH4F solution or diluted HF solution. Thereafter, a silicon oxide film having a thickness of 0.5 nm to 0.8 nm is formed on the substrate surface by oxidization in an atmosphere including oxygen. A hafnium silica oxide film not shown having a thickness of 0.2 nm is formed on the silicon oxide film 105 using tetraxis dietylamino hafnium, diethyl silane and oxygen. By applying surface treatment to the hafnium silica oxide film, a HfSiON film 106 is formed on the isolation dielectric film 102 and the silicon oxide film 105. The surface treatment includes a nitriding treatment in a nitrogen plasma atmosphere or $NH_3$ atmosphere and a heat treatment performed after the nitriding treatment, for example. The HfSiON film 106 may be formed without forming the silicon oxide film 105.

[FIG. 34]

A polycrystalline silicon film 203 is formed on HfSiON film 106. A resist 214 covering the nMOS region is formed. By ion implantation using the resist 214 as a mask, Al ions 215 are implanted into the polycrystalline silicon film 203 in the nMOS region.

[FIG. 35]

The resist 214 is removed, a hard mask 216 for gate processing is formed on the polycrystalline silicon film 203. By etching the polycrystalline silicon film 203 using the hard mask 216 as a mask, the polycrystalline silicon film having a gate shape is formed.

Here, the hard mask 216 comprises a silicon nitride film or silicon oxide film. The process for forming the hard mask 216 includes a step of forming a silicon nitride film or silicon oxide film on the polycrystalline silicon film 203, a step of forming a resist pattern on the silicon nitride film or silicon oxide film, and a step of etching the silicon nitride film or silicon oxide film using the resist pattern as a mask.

[FIG. 36]

The exposed HfSiON film 106 is removed by wet etching, further, the silicon oxide film 105 under the removed HfSiON film 106 is removed.

At this time, the etching conditions (etchant and etching time) are set so that the hard mask 216 is not lost by wet etching. The etchant and etching time are properly determined in accordance with a kind and thickness of high dielectric constant including Hf and oxygen (here, HfSiON film 106). high dielectric constant film

[FIG. 37]

An offset spacer 115 is formed by deposition of a dielectric film (e.g., silicon oxide film or silicon nitride film) by CVD process and etching of the dielectric film by RIE process.

Using a resist mask not shown, B ions are selectively implanted into an n-type diffusion layer (n-well), in the same way, using a resist mask not shown P ions or As ions are selectively implanted into a p-type diffusion layer (p-well), further, heat treatment is carried out, thereby each extension of source/drain regions 112 and 113 is formed.

Sidewall spacers 110 and 111 are formed by deposition of a dielectric film by CVD process and an etching of the dielectric film by RIE process. Here, the sidewall spacer 110 is formed of a silicon oxide film ($SiO_2$ film), the sidewall spacer 111 is formed of a silicon nitride film.

Using a resist mask not shown, B ions are selectively implanted into the n-type diffusion layer (n-well), in the same way, using a resist mask not shown P ions or As ions are selectively implanted into the p-type diffusion layer (p-well), further, heat treatment is carried out, thereby the remaining portions of source/drain regions 112 and 113 are formed.

In the present embodiment, the sidewall spacers 110 and 111 (silicon oxide film/silicon nitride film) of two-layer structure is used, but a sidewall spacer (silicon nitride film/silicon oxide film/silicon nitride film or silicon oxide film/silicon nitride film/silicon oxide film) of three-layer structure may be used. Because the offset spacer 115 is used as a mask for extension implantation and hollow implantation and the sidewall spacer is used as a mask for source/drain implantation, the offset spacer and the sidewall spacer may are different even though their the materials are the same. Further, a sidewall spacer of single-layer structure formed of a silicon oxide film may be used. The structure of the sidewall spacer is determined in accordance with devices.

[FIG. 38]

A silicide film 119 is formed on the source/drain regions 112 and 113 in a self-align manner by salicide process. Here, a NiPtSix film is used as the silicide film 119. Other than the NiPtSix film, for example, PtSi film, ErSi film, NiSix film and NiErSi film are usable.

[FIG. 39]

A silicon nitride film 121 as an etching stopper is formed on the entire surface, an interlayer dielectric 114 is formed on the silicon nitride film 121, thereafter, the surface is planarized.

The silicon nitride film 121 is formed by CVD process, for instance. Here, the interlayer dielectric 114 is a $SiO_2$ film. The planarization of the surface is carried out using CMP process or etching method (dry etching method or wet etching method). At this time, the planarization is carried out so that the polycrystalline silicon film 203 is exposed.

[FIG. 40]

A nickel film 206 is formed on the entire surface (region including the polycrystalline silicon film 203). The atomic density of silicon is $5.02 \times 10^{22}$ atoms/cm$^2$, the atomic density of nickel is $9.08 \times 10^{22}$ atoms/cm$^2$. Therefore, in order to react the whole of the polycrystalline silicon film with the nickel film, it is required that the thickness of the nickel film is higher than 0.7 times or more of the thickness of the polycrystalline silicon film 203.

[FIG. 41]

By heat treatment, the whole of the polycrystalline silicon film is reacted with the nickel film, thereby a Ni-rich nickel silicide gate electrode 109r is formed.

Further, by the heat treatment, in the pMOS region, aluminum in the polycrystalline silicon film 203 reacts with oxygen in the HfSiON film 106, thereby an AlO film 108 is formed on an interface between the nickel silicide gate electrode 109r and the HfSiON film 106. A no-reacted nickel film 206 is removed,

[FIG. 42]

A resist 217 covering the pMOS region is formed, thereafter, by ion implantation using the resist 217 as a mask, Al ions 218 are implanted into the nickel silicide gate electrode 109r of the nMOS region 103.

Thereafter, the resist 217 is removed, following heat treatment is carried out. By the heat treatment, in the nMOS region 103, aluminum in the nickel silicide gate electrode 109r diffuses to the interface between the nickel silicide gate electrode 109r and the HfSiON film 106. Thereby, in the nMOS region 103, an aluminum film 107 including small amount of oxygen is formed on the interface between the nickel silicide gate electrode 109r and the HfSiON film 106, the cMOS having the structure shown in FIG. 28 is obtained.

Thereafter, by going through the conventional process such as forming of interlayer dielectric, forming of contact hole, forming of contact plug, forming of interconnects and the like, the semiconductor integrated circuit is completed.

Sixth Embodiment

Figure 43:
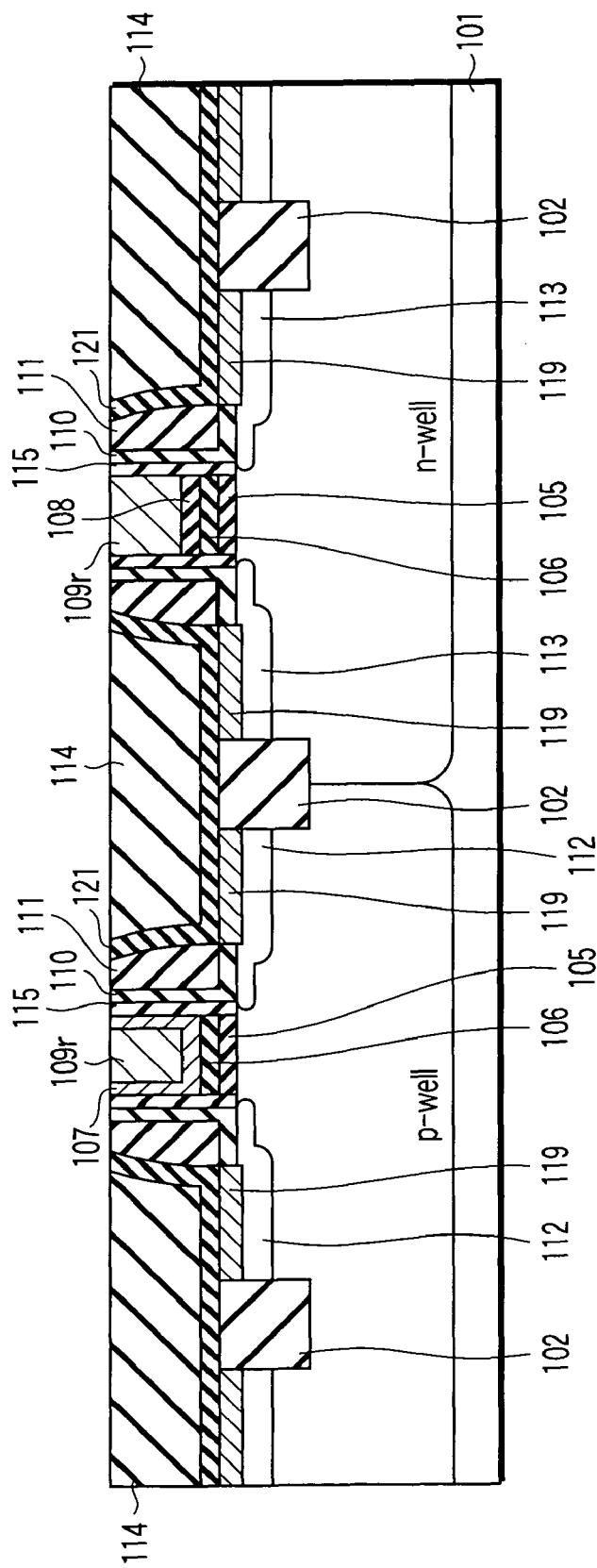
FIG. 43 is a cross-sectional view showing a semiconductor device according to a sixth embodiment.

FIG. 43 is a cross-sectional view showing a semiconductor device according to a sixth embodiment of the present invention.

The present embodiment is different from the fifth embodiment in that the aluminum film 107 including small amount of oxygen is further formed between the Ni-rich nickel silicide gate electrode 109r and the offset spacer 115. That is, in the nMOS region, the aluminum film 107 including small amount of oxygen is formed to cover the side and bottom of the nickel silicide gate electrode 109r.

In the present embodiment, the same effect as the fifth embodiment is obtained. In addition, as in the fifth embodiment, the threshold voltage for the LSTP is realized without putting F or N into the channel region.

Figure 44:
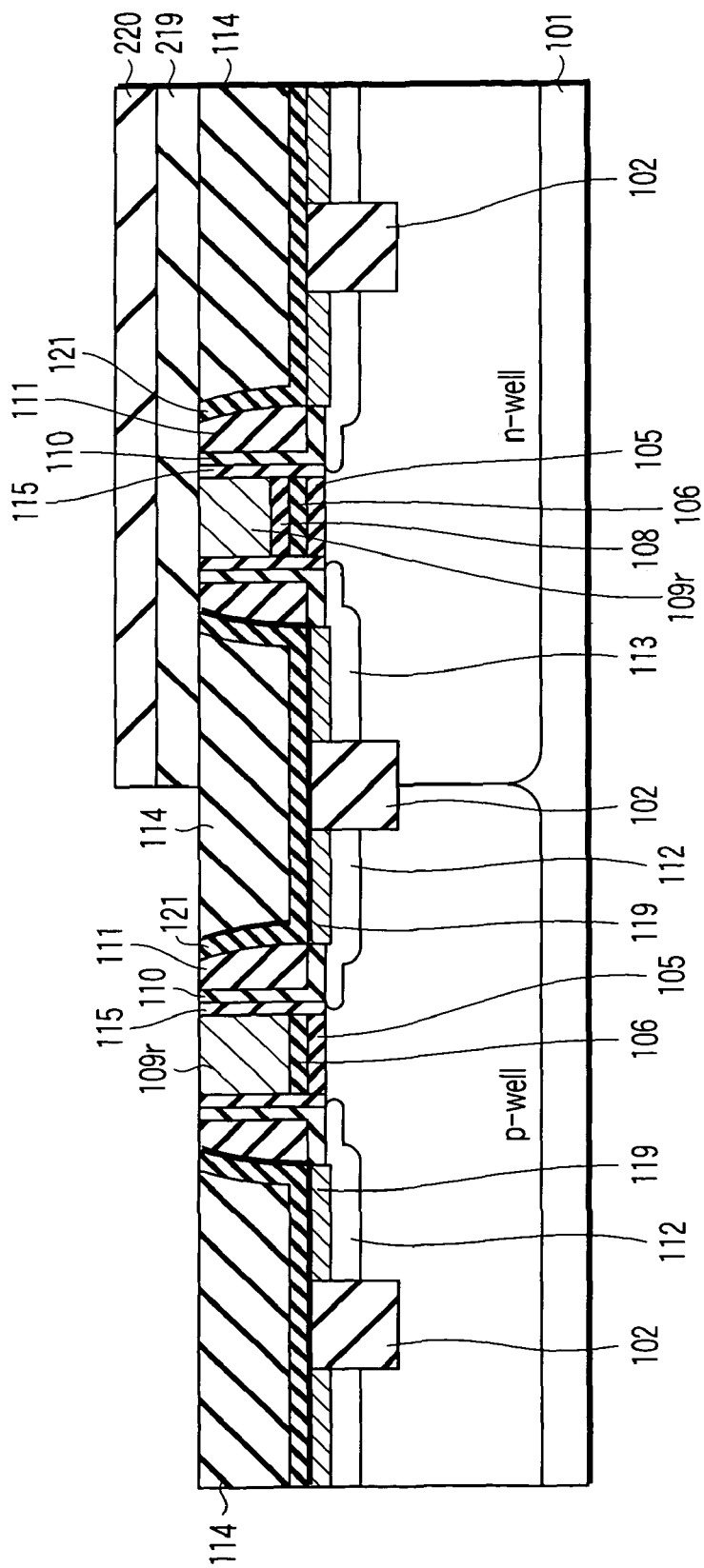
FIG. 44 is a cross-sectional view showing the method for manufacturing the semiconductor device according to the sixth embodiment.
Figure 45:
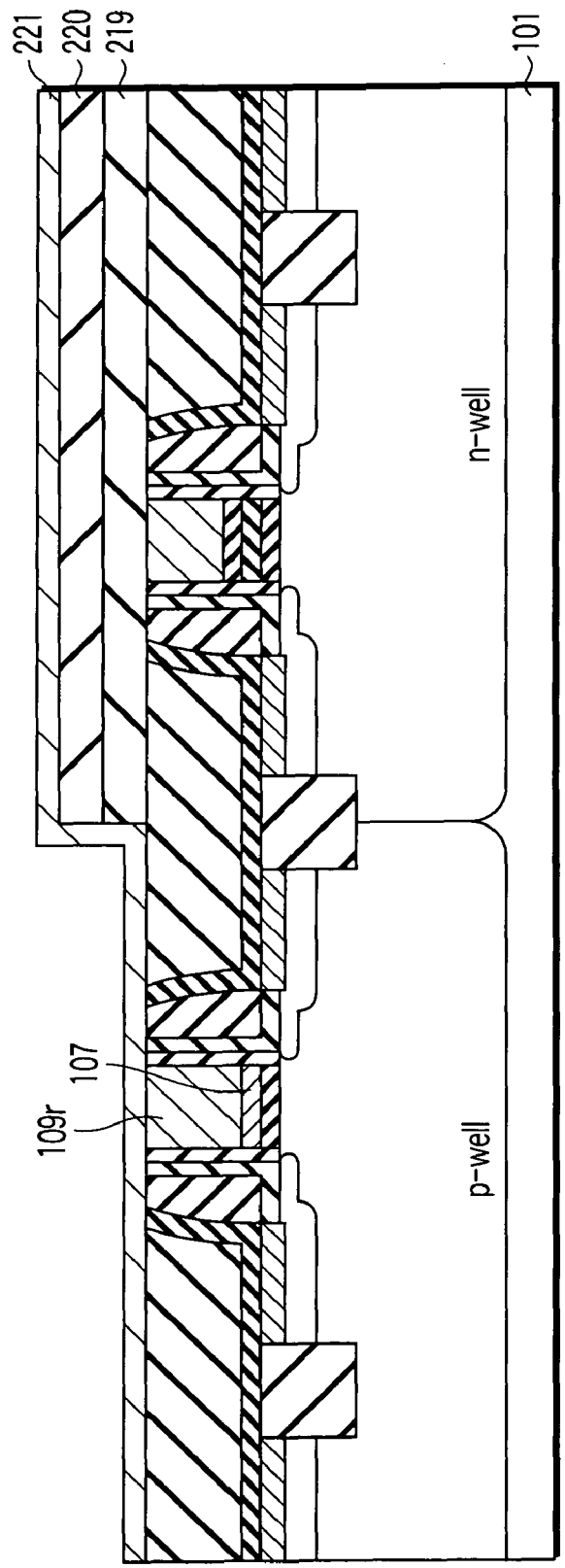
FIG. 45 is a cross-sectional view showing the method for manufacturing the semiconductor device according to the sixth embodiment following FIG. 44.
Figure 46:
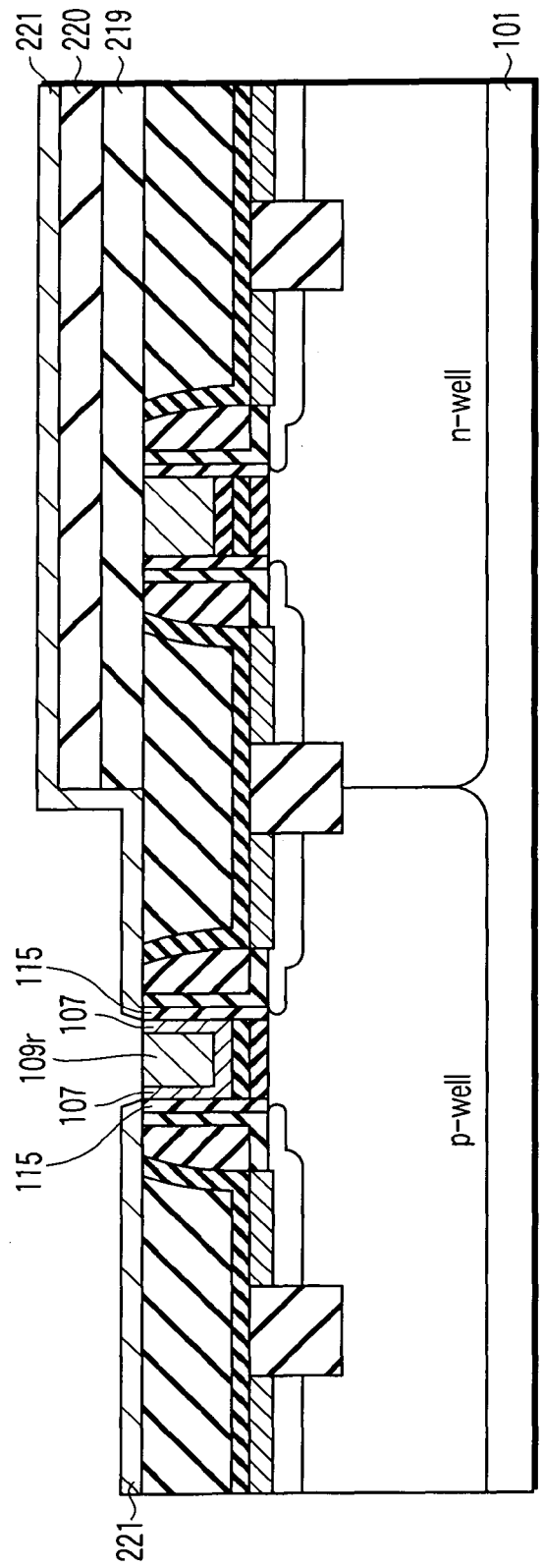
FIG. 46 is a cross-sectional view showing the method for manufacturing the semiconductor device according to the sixth embodiment following FIG. 45.

FIGS. 44 to 46 are cross-sectional views showing a method for manufacturing the semiconductor device according to the sixth embodiment.

First, the steps from FIG. 29 to FIG. 42 described in the fifth embodiment are carried out, thereafter, the resist 217 is removed.

[FIG. 44]

A silicon nitride film 219 and a silicon oxide film ($SiO_2$ film) 220 used as a mask are successively deposited on the entire surface, thereafter, the silicon nitride film 219 and the silicon oxide film 220 on the nMOS region are selectively removed by lithography process and etching. Therefore, the nMOS region is not covered with the silicon nitride film 219 and the silicon oxide film 220, the nickel silicide gate electrode 109r of the nMOS region is exposed.

Instead of the two-layer mask (the silicon nitride film 219 and the silicon oxide film 220), a single mask, for example, the silicon nitride film 219 or the silicon oxide film 220 may be used.

[FIG. 45]

An aluminum film 221 is deposited on the entire surface. The exposed surface of the nickel silicide gate electrode 109r of the nMOS region is covered with the aluminum film 221. The aluminum film 221 has a thickness of 4 to 40 nm, for example.

[FIG. 46]

Al of the aluminum film 221 is diffused on the interface the nickel silicide electrode 109r ad the offset spacer 115 by heat treatment at 400 to 500° C. In particular, Al of the aluminum film 221 on the nickel silicide gate electrode 109r of the nMOS region diffuses on the interface. By such the diffusion of Al, in the nMOS region, the aluminum film 107 including small amount of oxygen is formed to cover the side and bottom of the nickel silicide gate electrode 109r.

Thereafter, the remaining aluminum film 221 is removed by wet or dry treatment, the CMOS having the structure shown in FIG. 43 is obtained. And, by going through the conventional process such as forming of interlayer dielectric, forming of contact hole, forming of contact plug, forming of interconnects and the like, the semiconductor integrated circuit is completed.

The present invention is not limited to the embodiments. For example, in the first to sixth embodiments, n-channel and p-channel MOS transistors forming a CMOS are given as one example, the present invention is applicable to n-channel and p-channel MOS transistors formed in another circuit.

Moreover, the present invention is applicable to a p-channel MOS transistor only.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a p-channel MOS transistor provided on the semiconductor substrate, the p-channel MOS transistor comprising a first gate dielectric film including Hf, a second gate dielectric film provided on the first gate dielectric film and including aluminum oxide, and a first metal silicide gate electrode provided on the second gate dielectric film; and
    an n-channel MOS transistor comprising a third gate dielectric film including Hf, a conductive film provided on the third gate dielectric film and including aluminum, and a second metal silicide gate electrode provided on the conductive film, wherein the conductive film is configured to cover side and bottom surfaces of the second metal silicide gate electrode.

2. The semiconductor device according to claim 1, wherein the first gate dielectric film is a hafnium silicate nitride film, the second gate dielectric film is an $Al_2O_3$ film, the third gate dielectric film is a hafnium silicate nitride film, the conductive film is an aluminum film including oxygen.

3. The semiconductor device according to claim 1, wherein the p-channel MOS transistor and n-channel MOS transistor are elements of a CMOS.

4. The semiconductor device according to claim 2, wherein the p-channel MOS transistor and n-channel MOS transistor are elements of a CMOS.

* * * * *